[12] United States Patent
Koezuka et al.

(10) Patent No.: US 8,802,493 B2
(45) Date of Patent: Aug. 12, 2014

(54) MANUFACTURING METHOD OF OXIDE SEMICONDUCTOR DEVICE

(75) Inventors: Junichi Koezuka, Tochigi (JP); Shinji Ohno, Atsugi (JP); Yuichi Sato, Isehara (JP); Sachiaki Tezuka, Atsugi (JP); Tomokazu Yokoi, Atsugi (JP); Yusuke Shino, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/604,937

(22) Filed: Sep. 6, 2012

(65) Prior Publication Data

US 2013/0062600 A1 Mar. 14, 2013

(30) Foreign Application Priority Data

Sep. 13, 2011 (JP) ................................. 2011-199652

(51) Int. Cl.
*H01L 21/00* (2006.01)

(52) U.S. Cl.
USPC ......................................................... 438/104

(58) Field of Classification Search
CPC ..................... H01L 29/78618; H01L 29/7869; H01L 27/10873; H01L 27/1156; H01L 27/1203; H01L 21/2236; H01L 21/76856; H01L 21/76825
USPC .................................. 438/104, 474, 513, 798
See application file for complete search history.

(56) References Cited

U.S. PATENT DOCUMENTS

| 5,141,613 | A | * | 8/1992 | Adoncecchi et al. ...... 204/192.1 |
| 5,731,856 | A | | 3/1998 | Kim et al. |
| 5,744,864 | A | | 4/1998 | Cillessen et al. |
| 6,156,620 | A | * | 12/2000 | Puchner et al. ............... 438/400 |
| 6,294,274 | B1 | | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Nikolay Yushin
(74) *Attorney, Agent, or Firm* — Eric J. Robinson; Robinson Intellectual Property Law Office, P.C.

(57) ABSTRACT

The contact resistance between an oxide semiconductor film and a metal film is reduced. A transistor that uses an oxide semiconductor film and has excellent on-state characteristics is provided. A semiconductor device capable of high-speed operation is provided. In a transistor that uses an oxide semiconductor film, the oxide semiconductor film is subjected to nitrogen plasma treatment. Thus, part of oxygen included in the oxide semiconductor film is replaced with nitrogen, so that an oxynitride region is formed. A metal film is formed in contact with the oxynitride region. The oxynitride region has lower resistance than the other region of the oxide semiconductor film. In addition, the oxynitride region is unlikely to form high-resistance metal oxide at the interface with the contacting metal film.

16 Claims, 18 Drawing Sheets

(56) References Cited

U.S. PATENT DOCUMENTS

| | | | |
|---|---|---|---|
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,164,090 | B2 | 4/2012 | Iwasaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0246640 | A1 | 11/2006 | Kuwashima et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287221 | A1* | 12/2007 | Ong et al. ............ 438/104 |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0116500 | A1 | 5/2008 | Tokunaga |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0303069 | A1* | 12/2008 | Fuller et al. ............ 257/288 |
| 2009/0004764 | A1 | 1/2009 | Ohnuma et al. |
| 2009/0029503 | A1 | 1/2009 | Arai et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0283763 | A1* | 11/2009 | Park et al. ............ 257/43 |
| 2010/0065844 | A1 | 3/2010 | Tokunaga |
| 2010/0072467 | A1 | 3/2010 | Yamazaki et al. |
| 2010/0092800 | A1 | 4/2010 | Itagaki et al. |
| 2010/0109002 | A1 | 5/2010 | Itagaki et al. |
| 2010/0224871 | A1 | 9/2010 | Yamaguchi et al. |
| 2010/0301329 | A1 | 12/2010 | Asano et al. |
| 2011/0062436 | A1 | 3/2011 | Yamazaki et al. |
| 2011/0147738 | A1 | 6/2011 | Yamazaki et al. |
| 2011/0287580 | A1 | 11/2011 | Yamazaki et al. |
| 2012/0003795 | A1 | 1/2012 | Noda |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-220816 | 8/2007 |
| JP | 2010-093070 | 4/2010 |
| JP | 2011-049542 A | 3/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors,",Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

(56) References Cited

OTHER PUBLICATIONS

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 110-112.

Ohara.H et al., "21.3:4.0 IN. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; FE, GA, OR AL; B: MG, MN, FE, NI, CU,OR ZN] At Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

MANUFACTURING METHOD OF OXIDE SEMICONDUCTOR DEVICE

BACKGROUND OF THE INVENTION

1. Field of the Invention

The present invention relates to a semiconductor device and a method for manufacturing the semiconductor device.

Note that in this specification, a semiconductor device refers to any device that can function by utilizing semiconductor characteristics, and an electro-optical device, a semiconductor circuit, and an electronic device are all semiconductor devices.

2. Description of the Related Art

As materials of semiconductor thin films applicable to transistors, silicon-based semiconductor materials have been widely used, but oxide semiconductors have been attracting attention as alternative materials.

In many cases, transistors that use amorphous silicon, which can be manufactured using the established manufacturing technique, are utilized in display devices; however, the transistors that use amorphous silicon have low field-effect mobility, having difficulty in achieving high definition, low power consumption, and the like of display devices.

Further, the transistors that use amorphous silicon also have a problem of severe electrical characteristic deterioration (low reliability), which occurs with the temperature variation or repetitive operation.

As the integration becomes higher obeying the scaling law and the circuit structure becomes more complex, a problem of an increase in power consumption becomes more significant in semiconductor devices (such as semiconductor memory devices) utilizing transistors that use single crystal silicon and have high field-effect mobility.

Further, it is known that a transistor that uses an oxide semiconductor has a relatively high field-effect mobility compared with a transistor that uses amorphous silicon. An oxide semiconductor can be easily deposited on a large area by a sputtering method or the like, and application of the oxide semiconductor to display devices has been actively examined.

It is pointed out that aluminum oxide having high resistance is produced in the case of directly connecting an oxide semiconductor to an aluminum-based alloy wiring, thereby increasing contact resistance (see Patent Document 1).

Even in the case of using a metal that is relatively unlikely to be oxidized or a metal, an oxide of which has a conducting property, a metal oxide having high resistance is often produced at the interface between the metal and an oxide semiconductor by heat treatment or the like in a later process; accordingly, contact resistance is often increased.

There is a problem in that such high contact resistance between a metal and an oxide semiconductor causes a reduction in on-state characteristics of a transistor.

As a method for reducing the contact resistance, a technique in which a buffer layer having low resistance is provided between an oxide semiconductor and a metal is disclosed. In addition, an oxide semiconductor containing nitrogen, which serves as a buffer layer, is disclosed (see Patent Document 2).

REFERENCE

Patent Document

[Patent Document 1] Japanese Published Patent Application No. 2011-49542
[Patent Document 2] Japanese Published Patent Application No. 2011-9724

SUMMARY OF THE INVENTION

The on-state characteristics (e.g., on-state current) of a transistor that uses an oxide semiconductor film are higher than those of a transistor that uses an amorphous silicon film, but are not sufficiently high compared to those of a transistor that uses single crystal silicon.

In some cases, a semiconductor device formed using a transistor that uses single crystal silicon does not need to have such high on-state characteristics of a transistor as to be achieved by using single crystal silicon. In the case where a transistor that uses an oxide semiconductor film is applied to such a semiconductor device, enough performance cannot always be demonstrated due to low on-state characteristics of the transistor.

Specifically, some factors that inhibit carrier transfer may degrade the transistor on-state characteristics to about 30% to 70%, or 10% or less under certain circumstances, of the inherent on-state characteristics of the transistor. One of the factors that inhibit carrier transfer is contact resistance between an oxide semiconductor film and a metal film.

Thus, it is desired that in a transistor that uses an oxide semiconductor film, the contact resistance between an oxide semiconductor film and a metal film, which is a cause for lowering of on-state characteristics, be reduced.

In view of the foregoing, it is an object to reduce contact resistance between an oxide semiconductor film and a metal film.

Further, it is another object to provide a transistor that uses an oxide semiconductor film and has excellent on-state characteristics.

Still another object is to provide a semiconductor device capable of high-speed operation.

A semiconductor device according to an embodiment of the present invention includes an oxide semiconductor film over an insulating surface, a gate insulating film over the oxide semiconductor film, a gate electrode positioned over the gate insulating film and having substantially the same upper surface shape as the gate insulating film, an interlayer insulating film positioned over the oxide semiconductor film and the gate electrode and having an opening reaching part of the oxide semiconductor film, and a wiring positioned over the interlayer insulating film and being in contact with the oxide semiconductor film at the opening in the interlayer insulating film. A region which is in the oxide semiconductor film and is in contact with the wiring is an oxynitride region.

Further, a semiconductor device according to an embodiment of the present invention includes an oxide semiconductor film over an insulating surface, a gate insulating film covering the oxide semiconductor film, a gate electrode overlapping with the oxide semiconductor film with the gate insulating film sandwiched therebetween, an interlayer insulating film positioned over the oxide semiconductor film and the gate electrode and having an opening reaching part of the oxide semiconductor film, and a wiring positioned over the interlayer insulating film and being in contact with the oxide semiconductor film at the opening in the interlayer insulating film. A region which is in the oxide semiconductor film and is in contact with the wiring is an oxynitride region.

In a semiconductor device of an embodiment of the present invention, which has a transistor that uses an oxide semiconductor film, the oxide semiconductor film is subjected to nitrogen plasma treatment to replace part of oxygen included in the oxide semiconductor film with nitrogen and to thereby form an oxynitride region, and a metal film is formed in contact with the oxynitride region.

Note that microwave discharge nitrogen plasma is preferably used in the nitrogen plasma treatment because its damage to the oxide semiconductor film is small and it enables efficient formation of the oxynitride region.

The oxynitride region has a lower resistance than the other region of the oxide semiconductor film. Further, the oxynitride region has a lower oxygen proportion than the oxide semiconductor film right after the deposition; accordingly, a high-resistance metal oxide is unlikely to be formed at the interface with the contacting metal film. As a result, the contact resistance between the oxide semiconductor film and the metal film can be reduced.

Specifically, a semiconductor device according to an embodiment of the present invention is manufactured by forming an oxide semiconductor film over an insulating surface, forming a gate insulating film over the oxide semiconductor film, forming a gate electrode overlapping with the oxide semiconductor film with the gate insulating film sandwiched therebetween; performing treatment which reduces resistance of part of the oxide semiconductor film using the gate electrode as a mask, forming an interlayer insulating film covering the oxide semiconductor film, the gate insulating film and the gate electrode, forming an opening reaching a low-resistance region of the oxide semiconductor film by processing the interlayer insulating film and the gate insulating film, performing nitrogen plasma treatment on an exposed part of the low-resistance region of the oxide semiconductor film, and forming a metal film in contact with the exposed part of the low-resistance region of the oxide semiconductor film.

Note that it is preferable to form metal electrodes in regions that are between the insulating surface and the oxide semiconductor film and do not overlap with the gate electrode. The metal electrodes function as a source electrode and a drain electrode of the transistor.

The thickness of the oxynitride region varies depending on the conditions of the nitrogen plasma treatment or the conditions of the oxide semiconductor film such as the film quality or thickness. Specifically, when the intensity of the nitrogen plasma treatment is low and the thickness of the oxide semiconductor film is large enough, the oxynitride region is formed in a region that is relatively shallow from the vicinity of a surface of the oxide semiconductor film. In contrast, when the intensity of the nitrogen plasma treatment is high and the thickness of the oxide semiconductor film is small (e.g., 5 nm or smaller), the oxynitride region is formed down to an interface between the oxide semiconductor film and the base of the oxide semiconductor film.

In the case where metal electrodes are provided in regions that are between the base of the oxide semiconductor film and the oxide semiconductor film and do not overlap with the gate electrode, it is preferable to form the oxynitride region down to the interface between the oxide semiconductor film and the base in order to reduce the contact resistance.

The oxynitride region formed in the oxide semiconductor film enables a reduction in the contact resistance between the oxide semiconductor film and the metal film.

The reduction of the contact resistance enables provision of a transistor that uses an oxide semiconductor film and has excellent on-state characteristics.

By using the transistor that uses an oxide semiconductor film and has excellent on-state characteristics, a semiconductor device capable of high-speed operation can be provided.

DETAILED DESCRIPTION OF THE INVENTION (Embodiment 1)

In this embodiment, a transistor which is a semiconductor device according to an embodiment of the present invention and a method for manufacturing the transistor will be described with reference to FIGS. 1A to 1C, FIGS. 2A to 2C, FIGS. 3A to 3C, FIGS. 4A to 4C, FIGS. 5A to 5C, and FIGS. 6A to 6C.

Figure 1A:
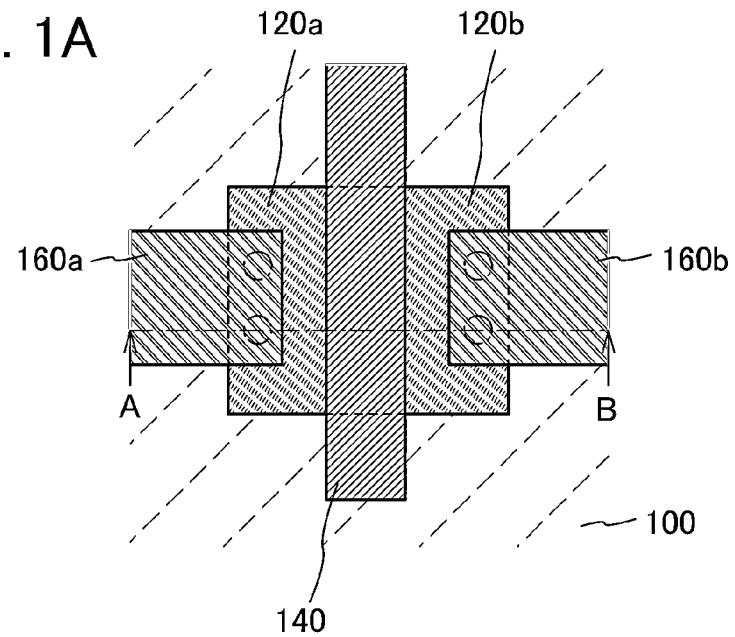
FIG. 1A is a top view and FIGS. 1B and 1C are cross-sectional views illustrating examples of a transistor according to an embodiment of the present invention.
Figure 1B:
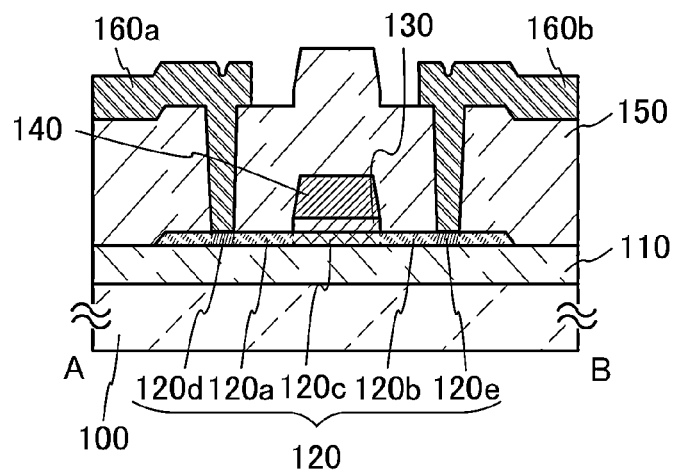
Figure 1C:
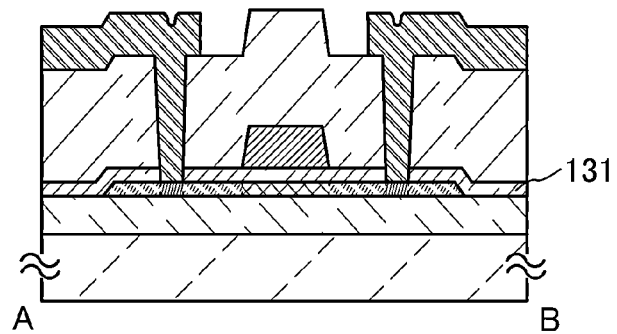

FIG. 1A is a top view and FIGS. 1B and 1C are cross-sectional views of transistors according to an embodiment of the present invention. FIGS. 1B and 1C illustrate cross section A-B taken along dashed-dotted line A-B in the top view of the transistor in FIG. 1A. A gate insulating film 130 in FIG. 1B and a gate insulating film 131 in FIG. 1C have different shapes. For easy understanding, an interlayer insulating film 150, the gate insulating film 130, the gate insulating film 131, and a base insulating film 110 are omitted in FIG. 1A.

The transistor illustrated in FIG. 1B includes the base insulating film 110 over a substrate 100; an oxide semiconductor film 120 over the base insulating film 110; the gate insulating film 130 over the oxide semiconductor film 120; a gate electrode 140 over the gate insulating film 130, which has substantially the same upper surface shape as the gate insulating film 130; the interlayer insulating film 150 over the oxide semiconductor film 120 and the gate electrode 140, which has openings that reach the oxide semiconductor film 120; and a wiring 160a and a wiring 160b over the interlayer insulating film 150, which are in contact with the oxide semiconductor film 120 at the openings provided in the interlayer insulating film 150. Note that the base insulating film 110 may be omitted.

The transistor illustrated in FIG. 1C includes the base insulating film 110 over the substrate 100; the oxide semiconductor film 120 over the base insulating film 110; the gate insulating film 131 covering the oxide semiconductor film 120; the gate electrode 140 overlapping with the oxide semiconductor film 120 with the gate insulating film 131 sandwiched therebetween; the interlayer insulating film 150 over the oxide semiconductor film 120 and the gate electrode 140, which has openings that reach the oxide semiconductor film 120; and the wiring 160a and the wiring 160b over the interlayer insulating film 150, which are in contact with the oxide semiconductor film 120 at the openings provided in the interlayer insulating film 150. Note that the base insulating film 110 may be omitted.

Here, the oxide semiconductor film 120 includes a low-resistance region 120a, a low-resistance region 120b, a high-resistance region 120c, an oxynitride region 120d, and an oxynitride region 120e.

The low-resistance region 120a and the low-resistance region 120b are regions including an impurity that reduces the resistance of the oxide semiconductor film. For example, the low-resistance region 120a and the low-resistance region 120b are regions including at least one kind of element selected from hydrogen, helium, boron, nitrogen, fluorine, neon, aluminum, phosphorus, argon, arsenic, krypton, indium, tin, antimony, and xenon.

The low resistance of the low-resistance region 120a and the low-resistance region 120b can suppress degradation of on-state characteristics of the transistor that uses the oxide semiconductor film 120. For example, the low-resistance region 120a and the low-resistance region 120b have a sheet resistance of 30 kΩ/sq or less, preferably 10 kΩ/sq or less, further preferably 1 kΩ/sq or less, and still further preferably 0.7 kΩ/sq or less.

The high-resistance region 120c is a region having a low concentration of components which are other than main components of the oxide semiconductor film, that is, impurities. For example, the concentrations of respective impurities in the high-resistance region 120c are each $1\times10^{20}$ atoms/cm$^3$ or less, preferably $5\times10^{19}$ atoms/cm$^3$ or less, and further preferably $1\times10^{19}$ atoms/cm$^3$ or less. However, it is difficult to strictly classify components as main components or impurities; therefore, an element included at 1 at. % or more is regarded as a main component in this specification.

The high-resistance region 120c is a region having a low density of defects. For example, the density of oxygen vacancies in the high-resistance region 120c is $1\times10^{16}$/cm$^3$ or less, preferably $1\times10^{15}$/cm$^3$ or less, and further preferably $1\times10^{14}$/cm$^3$ or less.

The high-resistance region 120c has a low concentration of impurities and a low density of defects. In the transistors illustrated in FIGS. 1B and 1C, a channel region is formed in the high-resistance region 120c, which results in excellent electrical characteristics and high reliability. Further, the off-state currents of the transistors are low. For example, the transistors can have an off-state current of $1\times10^{-18}$ A or less, preferably $1\times10^{-21}$ A or less, and further preferably $1\times10^{-24}$ A or less when having a channel length of 3 μm and a channel width of 1 μm.

The oxynitride region 120d and the oxynitride region 120e are regions where part of oxygen included in the oxide semiconductor film has been replaced with nitrogen. For example, the oxynitride region 120d and the oxynitride region 120e in the oxide semiconductor film include nitrogen at a concentration of 5 at. % or more, preferably 10 at. % or more, and further preferably 15 at. % or more.

The oxynitride region 120d and the oxynitride region 120e have the same thickness as the oxide semiconductor film 120 in FIGS. 1B and 1C; however, the thickness of the oxynitride region 120d and the oxynitride region 120e are not limited thereto. For example, the oxynitride region 120d and the oxynitride region 120e may be formed only in the vicinity of a surface of the oxide semiconductor film 120 (in a region that is 1 nm to 5 nm deep from the surface of the oxide semiconductor film 120). The oxynitride region 120d and the oxynitride region 120e may have a nitrogen concentration gradient in the thickness direction. In that case, the nitrogen concentration on the substrate 100 side is low.

Upper surface shapes of the oxynitride region 120d and the oxynitride region 120e are similar to the upper surface shapes of the openings provided in the interlayer insulating film 150. Thus, the wiring 160a and the wiring 160b are in contact with the oxynitride region 120d and the oxynitride region 120e, respectively, of the oxide semiconductor film 120.

Here, the oxide semiconductor film 120 may be formed using an In—Zn—O compound, a Sn—Zn—O compound, an Al—Zn—O compound, a Zn—Mg—O compound, a Sn—Mg—O compound, an In—Mg—O compound, an In—Ga—O compound, a Sn—Ga—Zn—O compound, an Al—Ga—Zn—O compound, a Sn—Al—Zn—O compound, an In—Sn—Ga—Zn—O compound, an In—Hf—Ga—Zn—O compound, an In—Al—Ga—Zn—O compound, an In—Sn—Al—Zn—O compound, an In—Sn—Hf—Zn—O compound, an In—Hf—Al—Zn—O compound, or an In—Zr—Y—Zn—O compound, for example.

Note that an "In—Zn—O compound" refers to an oxide including In and Zn as its main components and there is no particular limitation on the atomic ratio of In and Zn.

The oxide semiconductor film 120 is preferably formed using an In-M-Zn—O compound. Here, M refers to Ga, Al, Sn, Hf, La, Ce, Pr, Nd, Sm, Eu, Gd, Tb, Dy, Ho, Er, Tm, Yb, Lu, Ni, Ti, Y, or Zr. It is preferable to use an In-M-Zn—O compound where M is Ga or Sn.

M is preferably an element having a higher bonding energy with oxygen than In and Zn. In that case, since M having a higher bonding energy with oxygen is included, oxygen vacancies are less likely to be caused in the oxide semiconductor film.

It is preferable to use an In-M-Zn—O compound having a composition ratio equal to or closer to In:M:Zn=3:1:2 [atomic ratio] because, in that case, field-effect mobility of the transistor can be high.

The oxide semiconductor film 120 can be in a single crystal state, a polycrystalline (also referred to as polycrystal) state, an amorphous state, or the like.

The oxide semiconductor film 120 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts (or crystal regions) and amorphous parts (or amorphous regions) are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface on which the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface on which the oxide semiconductor layer is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface on which the CAAC-OS film is formed or a normal vector of a surface of the CAAC-OS film, the directions of the c-axes may be different from each other depending on the shape of the CAAC-OS film (the cross-sectional shape of the surface on which the CAAC-OS film is formed or the cross-sectional shape of the surface of the CAAC-OS film). Note that when the CAAC-OS film is formed, the direction of c-axis of the crystal part is the direction parallel to a normal vector of the surface on which the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Further alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used. It is preferable to use any of these substrates provided with a semiconductor element as the substrate 100.

Further alternatively, a flexible substrate may be used as the substrate 100. Note that as a method for forming a transistor over a flexible substrate, there is a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The base insulating film 110 may be formed to have a single-layer structure or a stacked-layer structure including at least one of silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

It is preferable that the base insulating film 110 be sufficiently flat. Specifically, the film serving as a base is provided so as to have an average surface roughness (Ra) of 1 nm or less, preferably 0.3 nm or less, further preferably 0.1 nm or less. When Ra is less than or equal to the above value, a crystal region is easily formed in the oxide semiconductor film 120. Note that Ra is obtained by expanding, into three dimensions, arithmetic mean surface roughness that is defined by JIS B 0601: 2001 (ISO4287:1997) so as to be able to apply it to a curved surface. Ra can be expressed as an "average value of the absolute values of deviations from a reference surface to a designated surface" and is defined by Formula 1.

$$Ra = \frac{1}{S_0} \int_{y_1}^{y_2} \int_{x_1}^{x_2} |f(x, y) - Z_0| \, dx \, dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the xy plane, and $Z_0$ represents the height of the reference surface (the average height of the specific surface). Ra can be measured using an atomic force microscope (AFM).

Silicon oxynitride refers to a substance that contains more oxygen than nitrogen and, for example, includes oxygen, nitrogen, silicon, and hydrogen at concentrations higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. Further, silicon nitride oxide refers to a substance that contains more nitrogen than oxygen and, for example, contains oxygen, nitrogen, silicon, and hydrogen at concentrations higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that percentages of oxygen, nitrogen, silicon, and hydrogen fall within the aforementioned ranges in the case where measurement is performed using Rutherford backscattering spectrometry (RBS) or hydrogen forward scattering (HFS). In addition, the total of the percentages of the constituent elements does not exceed 100 at. %.

It is preferable that an insulating film from which oxygen is released by heat treatment be used as the base insulating film 110.

"To release oxygen by heat treatment" means that the amount of released oxygen is greater than or equal to $1.0 \times 10^{18}$ atoms/cm$^3$, or greater than or equal to $3.0 \times 10^{20}$ atoms/cm$^3$ in TDS on an oxygen atom basis.

Here, a method for measuring the amount of released oxygen using TDS will be described.

The total amount of released gas from a measurement sample in TDS is proportional to the integral value of the ion intensity of the released gas. Then, this integral value is compared with the reference value of a reference sample, whereby the total amount of released gas can be calculated.

For example, the number of released oxygen molecules ($N_{O2}$) from a measurement sample can be calculated according to Formula 2 using the TDS results of a silicon wafer containing hydrogen at a predetermined density, which is the reference sample, and the TDS results of the measurement sample. Here, all gasses having a mass number of 32 which are obtained by the TDS are assumed to originate from an oxygen molecule. CH$_3$OH can be given as a gas having a mass number of 32, but is not taken into consideration on the assumption that CH$_3$OH is unlikely to be present. Further, an oxygen molecule including an oxygen atom having a mass number of 17 or 18, which is an isotope of an oxygen atom, is also not taken into consideration because the proportion of such a molecule in the natural world is minimal.

$$N_{O2} = \frac{N_{H2}}{S_{H2}} \times S_{O2} \times \alpha \quad \text{[FORMULA 2]}$$

$N_{H2}$ is the value obtained by conversion of the number of hydrogen molecules released from the reference sample into density. $S_{H2}$ is the integral value of ion intensity when the reference sample is analyzed by TDS. Here, the reference value of the reference sample is expressed by $N_{H2}/S_{H2}$. $S_{O2}$ is the integral value of ion intensity when the measurement sample is analyzed by TDS. $\alpha$ is a coefficient affecting the ion intensity in the TDS. For details of Formula 2, Japanese Published Patent Application No. H6-275697 is referred to. Note that the amount of released oxygen was measured with a thermal desorption spectroscopy apparatus produced by ESCO Ltd., EMD-WA1000S/W using a silicon wafer containing hydrogen atoms at $1 \times 10^{16}$ atoms/cm$^3$ as the reference sample.

Further, in the TDS, part of oxygen is detected as an oxygen atom. The ratio between oxygen molecules and oxygen atoms can be calculated from the ionization rate of oxygen molecules. Note that, since the above $\alpha$ includes the ionization rate of oxygen molecules, the number of released oxygen atoms can be estimated through the evaluation of the number of the released oxygen molecules.

Note that $N_{O2}$ is the number of released oxygen molecules. When the number of released oxygen molecules is converted into the number of released oxygen atoms, the number of released oxygen atoms is twice the number of released oxygen molecules.

The supply of oxygen from the base insulating film 110 to the oxide semiconductor film 120 can reduce the interface state density at the interface between the oxide semiconductor film 120 and the base insulating film 110. As a result, carrier trapping at the interface between the oxide semiconductor film 120 and the base insulating film 110 due to the operation of a transistor or the like can be suppressed, and thus, a highly reliable transistor can be obtained.

Further, in some cases, electric charge is generated due to oxygen vacancies in the oxide semiconductor film 120. In general, some oxygen vacancies in the oxide semiconductor film 120 serve as donors and cause release of electrons which are carriers. Consequently, the threshold voltage of a transistor shifts in the negative direction. When oxygen is sufficiently supplied from the base insulating film 110 to the oxide semiconductor film 120 and the oxide semiconductor film 120 preferably contains excessive oxygen, the density of oxygen vacancies in the oxide semiconductor film 120, which cause the negative shift of the threshold voltage, can be reduced.

The gate insulating film 130 and the gate insulating film 131 can be formed using a method and a material similar to those of the base insulating film 110.

The gate electrodes 140 can be formed to have a single-layer structure or a stacked-layer structure including at least one of Al, Ti, Cr, Co, Ni, Cu, Y, Zr, Mo, Ag, Ta, and W, a nitride of any of these elements, an oxide of any of these elements, and an alloy of any of these elements. Alternatively, an oxide or an oxynitride which contains at least In and Zn may be used. For example, an In—Ga—Zn—O—N compound or the like may be used.

The interlayer insulating film 150 is formed using a method and a material similar to those of the base insulating film 110.

It is preferable that the interlayer insulating film 150 have low relative permittivity and a sufficient thickness. For example, a silicon oxide film having a relative permittivity of approximately 3.8 and a thickness of greater than or equal to 300 nm and less than or equal to 1000 nm may be used. A surface of the interlayer insulating film 150 has a little charge because of the influence of atmospheric components and the like, which might cause the shift of the threshold voltage of the transistor. Therefore, it is preferable that the interlayer insulating film 150 have relative permittivity and a thickness such that the influence of the charge at the surface is sufficiently reduced. For the same reason, a resin film may be formed over the interlayer insulating film 150 to reduce the influence of the charge at the surface.

The wiring 160a and the wiring 160b can be formed using a method and a material similar to those of the gate electrode 140. Note that the wiring 160a and the wiring 160b may be formed in the same layer.

The wiring 160a and the wiring 160b are in contact with the oxynitride region 120d and the oxynitride region 120e, respectively, of the oxide semiconductor film 120. This contact suppresses generation of another layer (e.g., an oxide of the material of the wiring 160a and the wiring 160b) at the contact interface, thereby reducing the contact resistance.

Next, a method for manufacturing the transistor illustrated in FIG. 1B will be described with reference to FIGS. 2A to 2C, FIGS. 3A to 3C, FIGS. 4A to 4C, and FIGS. 5A to 5C.

Figure 2A:
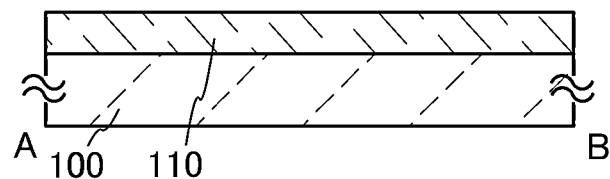
FIGS. 2A to 2C are cross-sectional views illustrating an example of a manufacturing process of a transistor according to an embodiment of the present invention.

First, the base insulating film 110 is formed over the substrate 100 (see FIG. 2A). The base insulating film 110 can be formed by a chemical vapor deposition (CVD) method, a sputtering method, a molecular beam epitaxy (MBE) method, or a pulsed laser deposition (PLD) method and is preferably formed by a sputtering method. Note that depending on the material of the substrate 100, it is not necessary to provide the base insulating film 110.

Figure 2B:
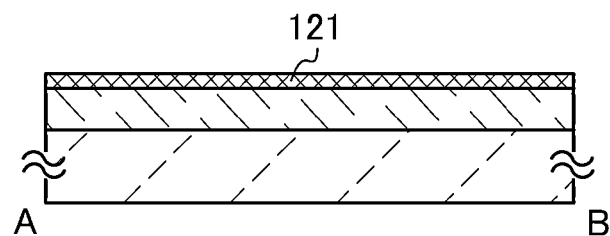

Next, an oxide semiconductor film 121 is formed (see FIG. 2B). The oxide semiconductor film 121 may be formed by a CVD method, a sputtering method, an MBE method, or a PLD method and is preferably formed by a sputtering method.

In the case where the oxide semiconductor film 121 is a CAAC-OS film, the oxide semiconductor film 121 may be formed by a sputtering method using a polycrystalline oxide semiconductor sputtering target, for example. By collision of ions with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining the crystal state, whereby the CAAC-OS film can be formed.

As an example of the sputtering target, an In—Ga—Zn—O compound target will be described below.

The In—Ga—Zn—O compound target, which is polycrystalline, is made by mixing $InO_x$ powder, $GaO_y$ powder, and $ZnO_z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

For the formation of the CAAC-OS film, the following conditions are preferably used.

By reducing the amount of impurities entering the CAAC-OS film during the formation thereof, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %. In the above-described manner, the oxide semiconductor film 121 which is a CAAC-OS film can be formed.

Next, first heat treatment is preferably performed. By the first heat treatment, the degree of crystallinity of the oxide semiconductor film 121 is increased and/or the concentration of impurities in the oxide semiconductor film 121 can be reduced so that the density of defects can be reduced.

The first heat treatment may be performed in an atmosphere selected from an oxidizing atmosphere, an inert atmosphere, a reduced-pressure atmosphere, and a dry-air atmosphere or in a combined atmosphere of two or more of the aforementioned atmospheres. Preferably, heat treatment is performed in an inert atmosphere or a reduced-pressure atmosphere and then heat treatment is further performed in an oxidizing atmosphere or a dry-air atmosphere. The first heat treatment may be performed at a temperature higher than or equal to 150° C. and lower than or equal to 650° C., preferably higher than or equal to 250° C. and lower than or equal to 500° C., and further preferably higher than or equal to 300° C. and lower than or equal to 450° C. A resistance heating method, a lamp heating method, a method using a heated gas, or the like may be used in the first heat treatment.

Note that an oxidizing atmosphere refers to an atmosphere containing an oxidizing gas. The oxidizing gas is oxygen, ozone, nitrous oxide, or the like, and it is preferable that the oxidizing gas do not contain water, hydrogen, and the like. For example, the purity of oxygen, ozone, or nitrous oxide introduced into a heat treatment apparatus is 8 N (99.999999%) or higher, preferably 9 N (99.9999999%) or higher. As the oxidizing atmosphere, an oxidizing gas mixed with an inert gas may be used. In that case, the mixture contains an oxidizing gas at a concentration at least higher than or equal to 10 ppm. By performing heat treatment in an oxidizing atmosphere, the density of oxygen vacancies in the oxide semiconductor film 121 can be reduced.

Further, an inert atmosphere refers to an atmosphere containing an inert gas such as nitrogen or a rare gas as the main component. Specifically, the concentration of a reactive gas such as an oxidizing gas in an inert atmosphere is lower than 10 ppm. By performing heat treatment in an inert atmosphere, the concentration of impurities included in the oxide semiconductor film 121 can be reduced.

A reduced-pressure atmosphere refers to an atmosphere with a pressure of a treatment chamber of lower than or equal to 10 Pa. By performing heat treatment in a reduced-pressure atmosphere, the concentration of impurities included in the oxide semiconductor film 121 can become low as compared to the case of employing the inert atmosphere.

The dry-air atmosphere refers to an atmosphere with a dew point of lower than or equal to −40° C., preferably lower than or equal to −50° C. and with an oxygen content of approximately 20% and a nitrogen content of approximately 80%. The dry-air atmosphere is a kind of oxidizing atmosphere. Since the dry-air atmosphere is relatively low in cost, it is suitable for mass production.

Figure 2C:
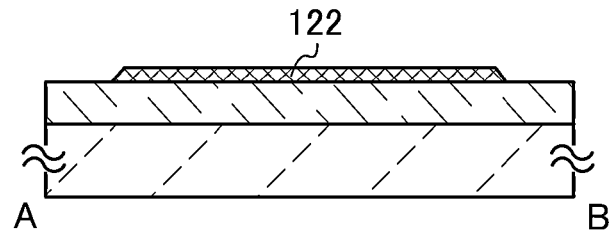

Next, the oxide semiconductor film 121 is processed, so that an oxide semiconductor film 122 is formed (see FIG. 2C). Note that the term "processing" means performing etching treatment using a resist mask that is formed by a photolithography method to obtain a film having a desired shape.

Figure 3A:
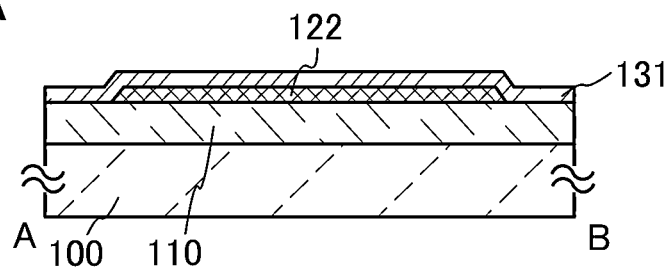
FIGS. 3A to 3C are cross-sectional views illustrating an example of a manufacturing process of a transistor according to an embodiment of the present invention.

Next, a gate insulating film 131 is formed (see FIG. 3A). The gate insulating film 131 may be formed by a CVD method, a sputtering method, an MBE method, or a PLD method and is preferably formed by a sputtering method.

Figure 3B:
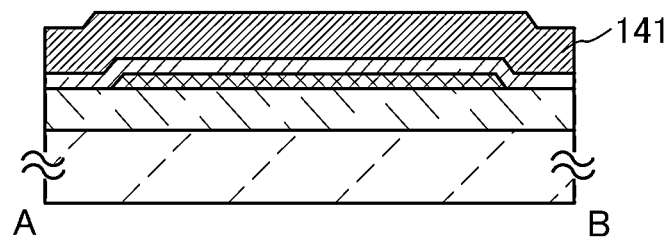

Next, a conductive film 141 is formed (see FIG. 3B). The conductive film 141 may be formed by a CVD method, a sputtering method, an MBE method, or a PLD method and is preferably formed by a sputtering method.

Figure 3C:
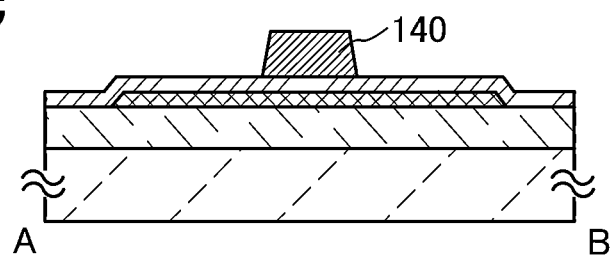

Then, the conductive film 141 is processed, so that the gate electrode 140 is formed (see FIG. 3C).

Figure 4A:
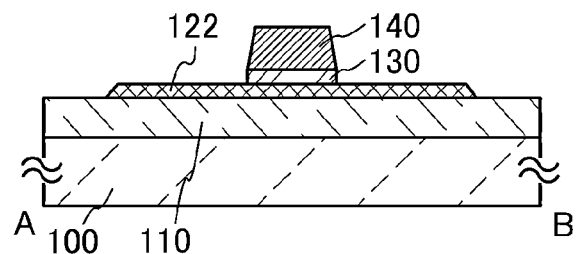
FIGS. 4A to 4C are cross-sectional views illustrating an example of a manufacturing process of a transistor according to an embodiment of the present invention.

Next, the gate insulating film 131 is processed to have an upper surface shape that is similar to that of the gate electrode 140, so that a gate insulating film 130 is formed (see FIG. 4A). For the processing of the gate insulating film 130, the gate electrode 140 or the resist mask that is used for processing the gate electrode 140 may be used.

Figure 4B:
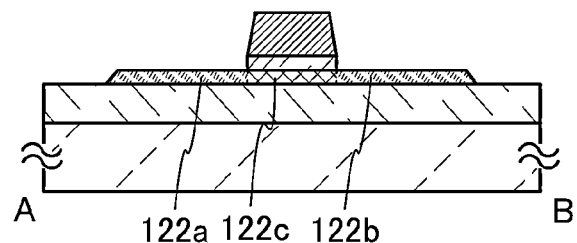

Next, using the gate electrode 140 as a mask, impurities that reduce the resistance of the oxide semiconductor film 122 are added to the oxide semiconductor film 122, so that a low-resistance region 122a and a low-resistance region 122b are formed (see FIG. 4B). Note that a region to which the impurities that reduce the resistance of the oxide semiconductor film are not added is a high-resistance region 122c.

As the added impurities that reduce the resistance of the oxide semiconductor film, one or more of hydrogen, helium, boron, nitrogen, fluorine, neon, aluminum, phosphorus, argon, arsenic, krypton, indium, tin, antimony, and xenon may be used. The method for adding the impurities may be an ion implantation method or an ion doping method. Alternatively, plasma treatment or heat treatment in an atmosphere including the impurities that reduce the resistance of the oxide semiconductor film may be employed. Preferably, an ion implantation method is used. Further alternatively, after adding the impurities that reduce the resistance of the oxide semiconductor film by an ion implantation method, heat treatment may be performed in an inert atmosphere or a reduced-pressure atmosphere.

Figure 4C:
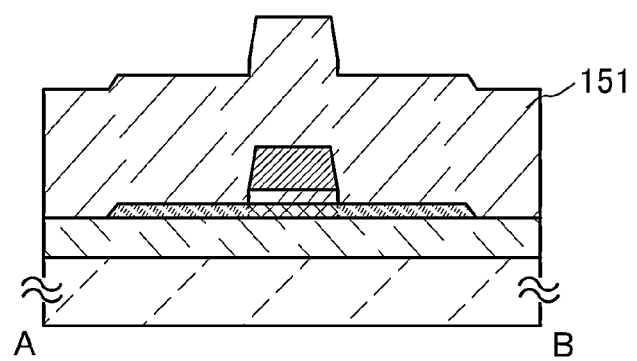

Next, an interlayer insulating film 151 is formed (see FIG. 4C). The interlayer insulating film 151 may be formed by a CVD method, a sputtering method, an MBE method, a PLD method, or a spin coating method and is preferably formed by a CVD method or a sputtering method.

Figure 5A:
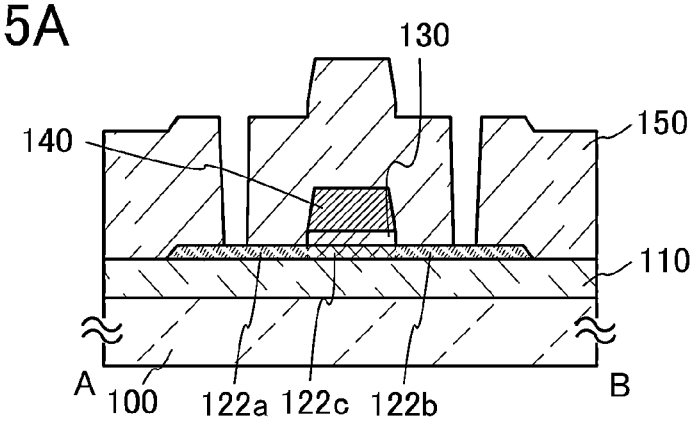
FIGS. 5A to 5C are cross-sectional views illustrating an example of a manufacturing process of a transistor according to an embodiment of the present invention.

Next, the interlayer insulating film 151 is processed, so that the interlayer insulating film 150 having openings which reach the low-resistance region 122a and the low-resistance region 122b is formed (see FIG. 5A).

Figure 5B:
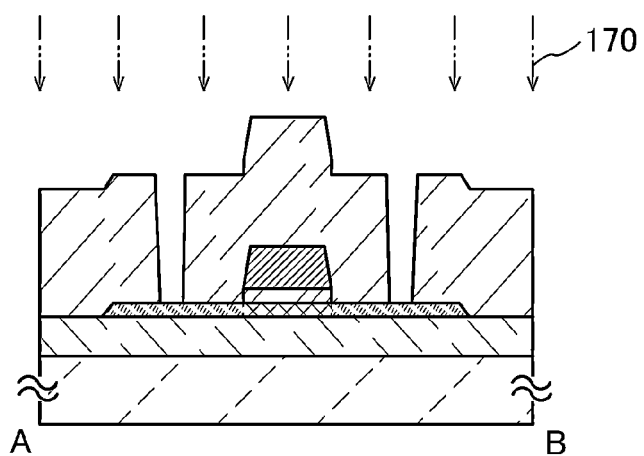

Next, treatment using microwave discharge nitrogen plasma 170 is performed (see FIG. 5B). The treatment using the microwave discharge nitrogen plasma 170 may be performed with any apparatus that is capable of microwave discharge without limitation to a particular apparatus; for example, a CVD apparatus or an etching apparatus may be used. Specifically, the treatment using the microwave discharge nitrogen plasma 170 may be performed in an atmosphere including nitrogen or including nitrogen and argon at a pressure of higher than or equal to 1 Pa and lower than or equal to 1000 Pa, preferably higher than or equal to 1 Pa and lower than or equal to 100 Pa, at a temperature of a stage over which a substrate is set of higher than or equal to room temperature and lower than or equal to 600° C., preferably higher than or equal to 300° C. and lower than or equal to 450° C., and at a power of greater than or equal to 100 W and less than or equal to 10000 W, preferably greater than or equal to 2000 W and less than or equal to 4000 W. The frequency of the microwave may be higher than or equal to 2 GHz and lower than or equal to 4 GHz, and may be 2.45 GHz, for example.

In this embodiment, the treatment is performed using the microwave discharge nitrogen plasma; however, the treatment is not limited thereto. For example, nitrogen plasma treatment that can replace part of oxygen included in the oxide semiconductor film with nitrogen may be employed.

Figure 5C:
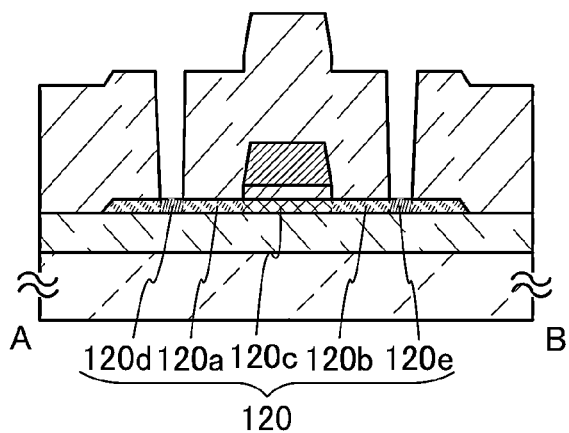

By the above-described treatment using the microwave discharge nitrogen plasma 170, the oxynitride region 120d and the oxynitride region 120e can be formed in part of the oxide semiconductor film 120 (see FIG. 5C). The oxide semiconductor film 120 further includes the low-resistance region 120a, the low-resistance region 120b, and the high-resistance region 120c. The low-resistance region 120a and the low-resistance region 120b refer to the low-resistance region 122a and the low-resistance region 122b in which the oxynitride region 120d and the oxynitride region 120e are formed. Note that different reference numerals are assigned to the high-resistance region 120c and the high-resistance region 122c for convenience; however, the high-resistance region 120c and the high-resistance region 122c have the same composition ratio and shape.

Next, the wiring 160a and the wiring 160b are formed; thus, the transistor illustrated in FIG. 1B is completed. The obtained transistor may be covered by a resin.

Similarly, a method for manufacturing the transistor illustrated in FIG. 1C will be described with reference to FIGS. 2A to 2C, FIGS. 3A to 3C, and FIGS. 6A to 6C.

Since the method for manufacturing the transistor in the steps illustrated in FIGS. 2A to 2C and FIGS. 3A to 3C is the same as that in the case of the transistor illustrated in FIG. 1B, description of the steps is omitted.

Figure 6A:
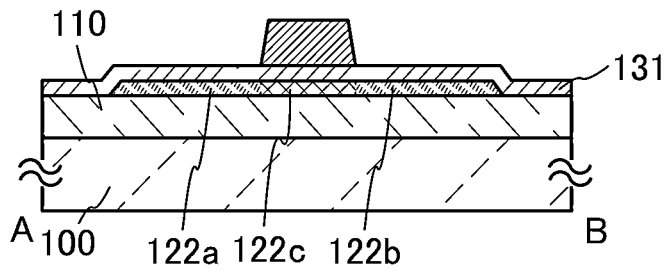
FIGS. 6A to 6C are cross-sectional views illustrating an example of a manufacturing process of a transistor according to an embodiment of the present invention.

After the gate electrode 140 is formed as illustrated in FIG. 3C, impurities that reduce the resistance of the oxide semiconductor film 122 are added to the oxide semiconductor film 122, so that the low-resistance region 122a and the low-resistance region 122b are formed (see FIG. 6A). Note that a region to which the impurities that reduce the resistance of the oxide semiconductor film are not added is a high-resistance region 122c.

Figure 6B:
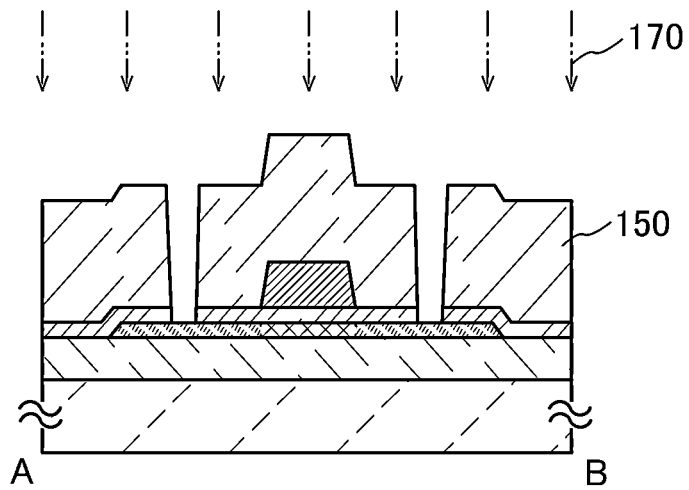

Next, the interlayer insulating film 150 is formed, and then the treatment using the microwave discharge nitrogen plasma 170 is performed (see FIG. 6B).

Figure 6C:
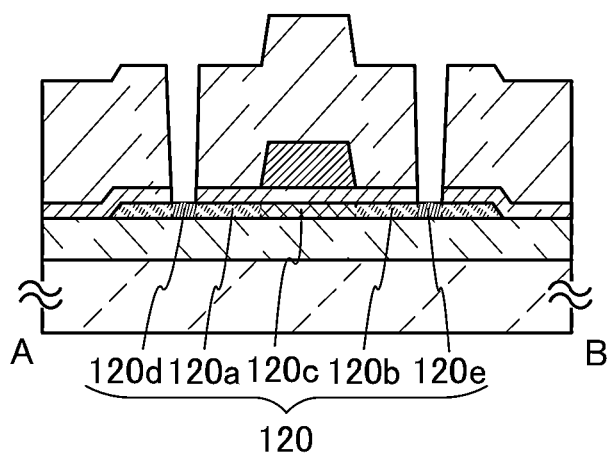

By the above-described treatment using the microwave discharge nitrogen plasma 170, the oxynitride region 120d and the oxynitride region 120e can be formed in the oxide semiconductor film 120 (see FIG. 6C). In addition, the oxide semiconductor film 120 further includes the low-resistance region 120a, the low-resistance region 120b, and the high-resistance region 120c.

Next, the wiring 160a and the wiring 160b are formed; thus, the transistor illustrated in FIG. 1C is completed. The obtained transistor may be covered by a resin.

In the above-described manner, the contact resistance between an oxide semiconductor film and a metal film can be reduced. The low contact resistance between the oxide semiconductor film and the metal film enables provision of a transistor that uses an oxide semiconductor film and has excellent on-state characteristics.

This embodiment can be implemented in appropriate combination with any of the other embodiments or examples.

(Embodiment 2)

In this embodiment, transistors having structures different from those of the transistors in Embodiment 1 and a method for manufacturing the transistors will be described with reference to FIGS. 7A to 7C and FIGS. 8A to 8C.

Figure 7A:
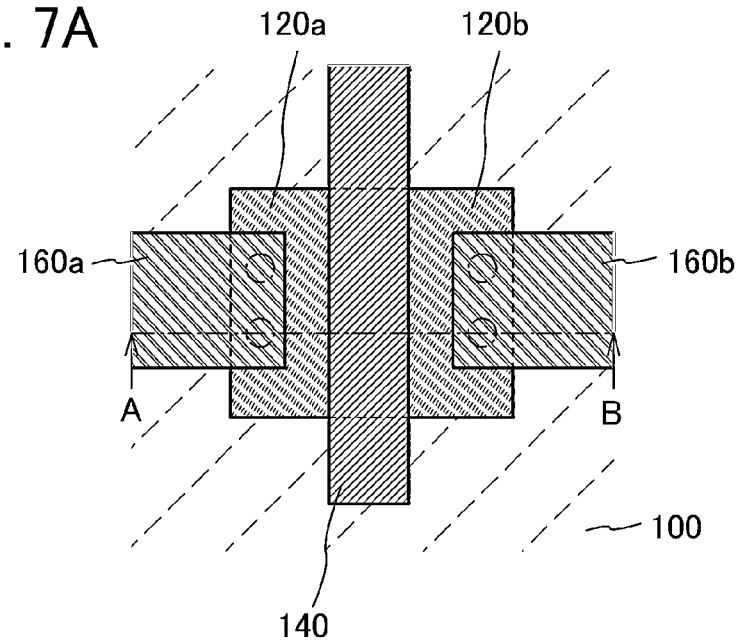
FIG. 7A is a top view and FIGS. 7B and 7C are cross-sectional views illustrating examples of a transistor according to an embodiment of the present invention.
Figure 7B:
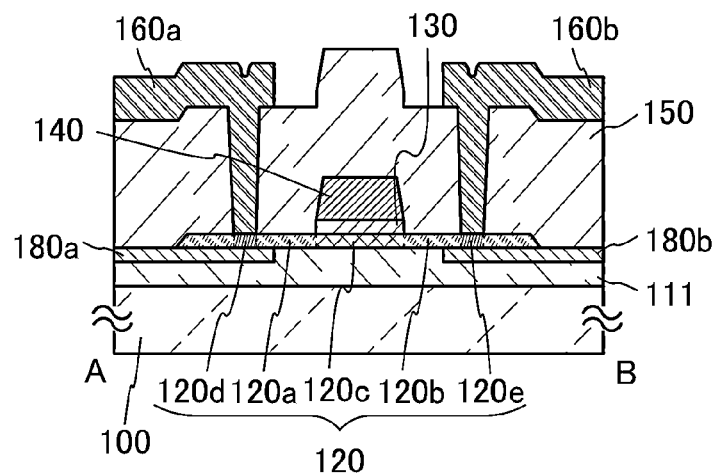
Figure 7C:
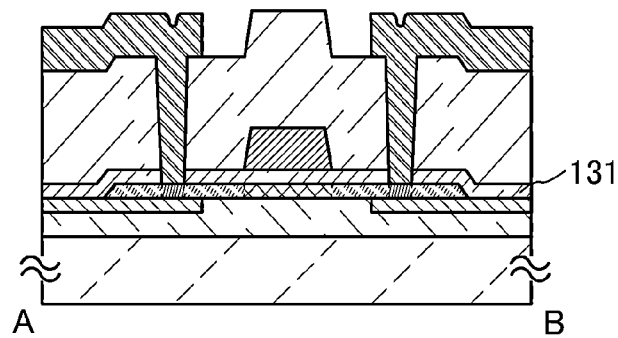

FIG. 7A is a top view and FIGS. 7B and 7C are cross-sectional views of transistors which are semiconductor devices according to an embodiment of the present invention. FIGS. 7B and 7C illustrate cross section A-B taken along dashed-dotted line A-B in the top view of the transistor in FIG. 7A. The gate insulating film 130 in FIG. 7B and the gate insulating film 131 in FIG. 7C have different shapes. For easy understanding, the interlayer insulating film 150, the gate insulating film 130, the gate insulating film 131, an electrode 180a, an electrode 180b, and a base insulating film 111 are omitted in FIG. 7A.

The transistor illustrated in FIG. 7B includes the base insulating film 111 having depressions, over the substrate 100; the electrode 180a and the electrode 180b provided in the depressions of the base insulating film 111, an oxide semiconductor film 120 over the base insulating film 111, the electrode 180a, and the electrode 180b; the gate insulating film 130 over the oxide semiconductor film 120; the gate electrode 140 over the gate insulating film 130, which has substantially the same top surface shape as the gate insulating film 130; the interlayer insulating film 150 over the oxide semiconductor film 120 and the gate electrode 140, which has openings that reach the oxide semiconductor film 120; and the wiring 160a and the wiring 160b over the interlayer insulating film 150, which are in contact with the oxide semiconductor film 120 at the openings provided in the interlayer insulating film 150.

The transistor illustrated in FIG. 7C includes the base insulating film 111 having depressions, over the substrate 100; the electrode 180a and the electrode 180b provided in the depressions of the base insulating film 111, the oxide semiconductor film 120 over the base insulating film 111, the electrode 180a, and the electrode 180b; the gate insulating film 131 covering the oxide semiconductor film 120; the gate electrode 140 overlapping with the oxide semiconductor film 120 with the gate insulating film 131 sandwiched therebetween; the interlayer insulating film 150 over the oxide semiconductor film 120 and the gate electrode 140, which has openings that reach the oxide semiconductor film 120; and the wiring 160a and the wiring 160b over the interlayer insulating film 150, which are in contact with the oxide semiconductor film 120 at the openings provided in the interlayer insulating film 150.

The electrode 180a and the electrode 180b can be formed using a method and a material similar to those of the gate electrode 140. Note that the electrode 180a and the electrode 180b may be formed in the same layer.

The depth of the depression provided in the base insulating film 111 is set to be substantially the same as the thickness of the electrode 180a and the electrode 180b. In this manner, the oxide semiconductor film 120 that is formed over the base insulating film 111, the electrode 180a, and the electrode 180b can be formed on a flat surface. Note that the depth of the depression provided in the base insulating film 111 may be different from the thickness of the electrode 180a and the electrode 180b.

By providing the electrode 180a and the electrode 180b, the contact area of the electrodes is increased as compared to the cases of the transistors described in Embodiment 1; thus, on-state characteristics of the transistors in this embodiment can be further improved.

Next, a method for manufacturing the transistors illustrated in FIGS. 7B and 7C will be described with reference to FIGS. 2A to 2C, FIGS. 3A to 3C, FIGS. 4A to 4C, FIGS. 5A to 5C, FIGS. 6A to 6C, and FIGS. 8A to 8C.

The transistors described in this embodiment are different from the transistors described in Embodiment 1 in that the base insulating film 111, the electrode 180a, and the electrode 180b are provided.

Therefore, description of Embodiment 1 can be referred to for part of the method for manufacturing the transistors in this embodiment.

Figure 8A:
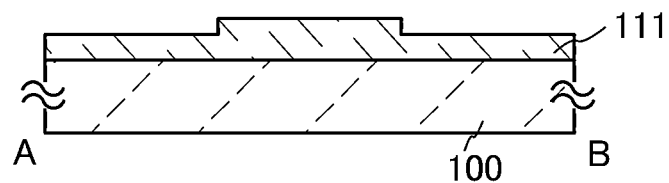
FIGS. 8A to 8C are cross-sectional views illustrating an example of a manufacturing process of a transistor according to an embodiment of the present invention.
Figure 8B:
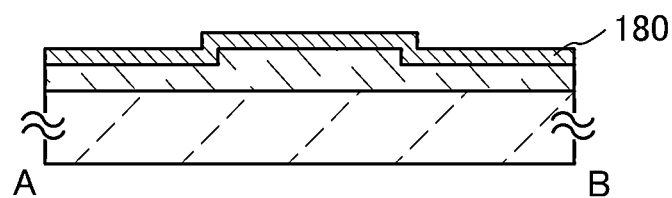
Figure 8C:
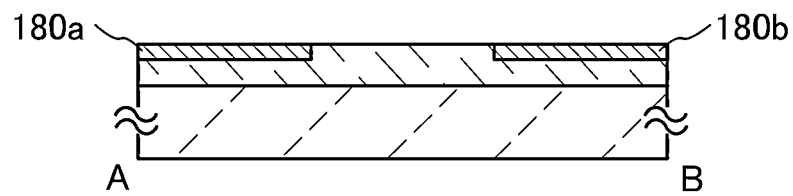

FIGS. 8A to 8C illustrate a method for forming the base insulating film 111, the electrode 180a, and the electrode 180b.

First, the base insulating film 110 is formed over the substrate 100 (see FIG. 2A).

Next, the base insulating film 110 is processed to form the base insulating film 111 having depressions (see FIG. 8A).

Next, a conductive film 180 is formed (see FIG. 8B). The conductive film 180 may be formed by a CVD method, a sputtering method, an MBE method, or a PLD method and is preferably formed by a sputtering method.

Next, the conductive film 180 is processed to form the electrode 180a and the electrode 180b (see FIG. 8C). The processing of the conductive film 180 may be performed by CMP (chemical mechanical polishing) treatment. By the CMP treatment, an uppermost surface of the base insulating film 111 can be substantially at the same level as the uppermost surfaces of the electrode 180a and the electrode 180b.

Note that the method for processing the conductive film 180 to form the electrode 180a and the electrode 180b is not limited to the CMP treatment. For example, the electrode 180a and the electrode 180b may be formed in such a manner that a planarization film is formed over the conductive film 180, and part of the planarization film and part of the conductive film 180 are etched until a projection of the base insulating film 111 is exposed. In such a case, the etching of the planarization film and the conductive film 180 is preferably performed under conditions in which the etching rate of the planarization film is substantially the same as that of the conductive film 180.

For the later process of the manufacturing method, Embodiment 1 can be referred to.

By providing the electrode 180a and the electrode 180b, the transistor can operate, for example, even in the case where an opening penetrating the oxide semiconductor film 122 is formed at the time of forming the interlayer insulating film 150 (at the time of forming the openings). Accordingly, yield of the transistor can be increased.

In the above-described manner, the contact resistance between an oxide semiconductor film and a metal film can be reduced. The low contact resistance enables provision of a transistor that uses an oxide semiconductor film and has excellent on-state characteristics.

This embodiment can be implemented in appropriate combination with any of the other embodiments or examples.

(Embodiment 3)

In this embodiment, an example of manufacturing a semiconductor memory device using any of the transistors described in Embodiment 1 and 2 will be described.

Typical examples of a volatile semiconductor memory device include a dynamic random access memory (DRAM) which stores data by selecting a transistor included in a memory element and accumulating an electric charge in a capacitor, and a static random access memory (SRAM) which holds stored data using a circuit such as a flip-flop.

Typical examples of a nonvolatile semiconductor memory device include a flash memory which has a node between a gate electrode and a channel region of a transistor and stores data by holding an electric charge in the node.

Any of the transistors described in Embodiment 1 and 2 can be applied to some of transistors included in the above-described semiconductor memory device.

Figure 9A:
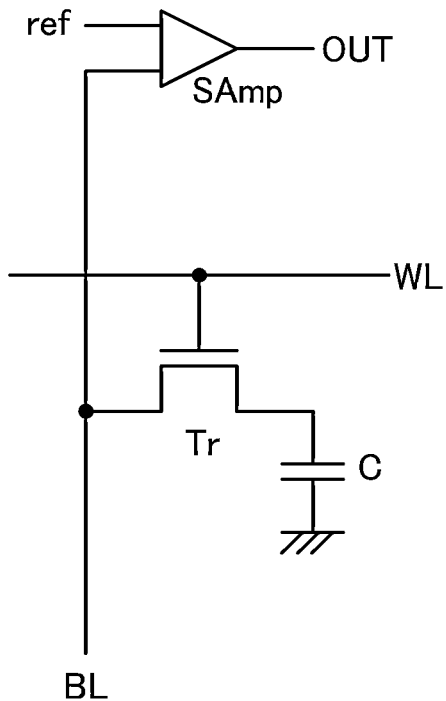
FIG. 9A is a circuit diagram illustrating an example of a semiconductor memory device including a transistor according to an embodiment of the present invention and FIG. 9B shows electrical characteristics.

First, a memory cell included in a semiconductor memory device to which any of the transistors described in Embodiment 1 and 2 is applied will be described with reference to FIGS. 9A and 9B.

The memory cell includes a transistor Tr and a capacitor C. One of a source and a drain of the transistor Tr is connected to a bit line BL, a gate of the transistor Tr is connected to a word line WL, the other of the source and the drain of the transistor Tr is connected to the capacitor C, and the bit line BL is connected to a sense amplifier SAmp (see FIG. 9A).

Figure 9B:
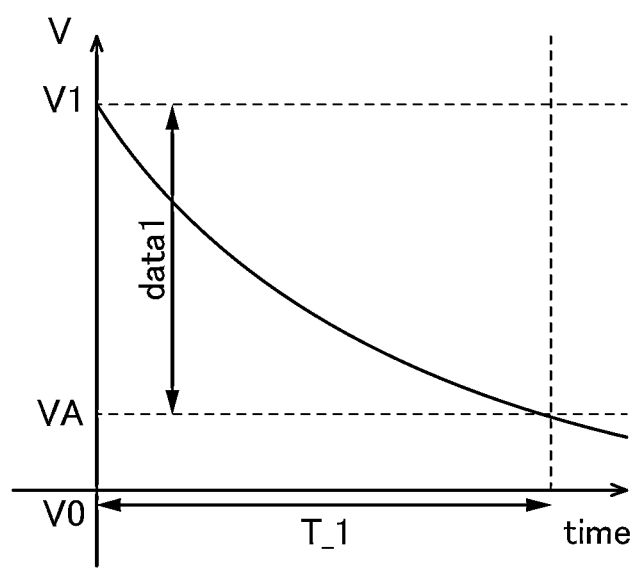

Note that it is known that the voltage held in the capacitor C is gradually decreased with time as shown in FIG. 9B owing to the off-state current of the transistor Tr. A voltage originally charged from V0 to V1 is decreased with time to VA that is a limit for reading out data 1. This period is called a holding period T_1. In the case of a two-level memory cell, refresh operation needs to be performed within the holding period T_1.

Here, when any of the transistors described in Embodiment 1 and 2 is used as the transistor Tr, the holding period T_1 can be increased because off-state current is small. That is, frequency of the refresh operation can be reduced; thus, power consumption can be reduced. For example, in the case of applying a transistor including an oxide semiconductor film in which an off-state current is less than or equal to $1 \times 10^{-21}$ A, preferably less than or equal to $1 \times 10^{-24}$ A, a memory cell that can hold data for several days to several decades without supply of electric power can be formed.

As described above, according to one embodiment of the present invention, a semiconductor memory device with high reliability and low power consumption can be provided.

By applying any of the transistors having excellent on-state characteristics described in Embodiment 1 and 2, it is possible to provide a semiconductor memory device capable of high-speed operation, in which charge can be quickly accumulated in the capacitor C.

Next, a memory cell included in a semiconductor memory device to which any of the transistors described in Embodiment 1 and 2 is applied will be described with reference to FIGS. 10A and 10B.

Figure 10A:
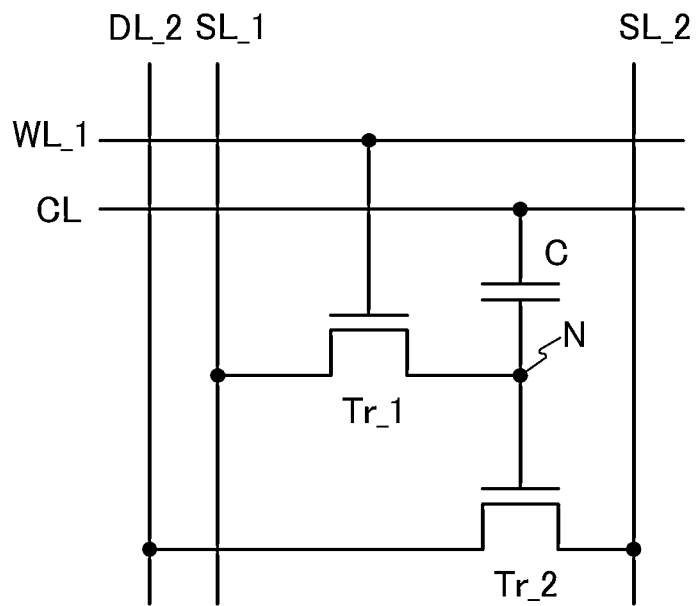
FIG. 10A is a circuit diagram illustrating an example of a semiconductor memory device including a transistor according to an embodiment of the present invention and FIG. 10B shows electrical characteristics.
Figure 10B:
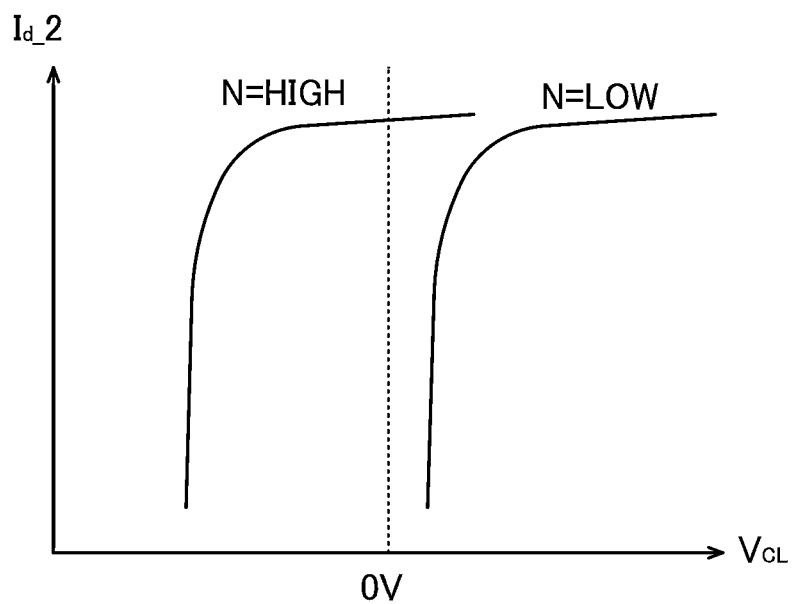

FIG. 10A is a circuit diagram of a memory cell. The memory cell includes a transistor Tr_1, a transistor Tr_2, and a capacitor C. A gate of the transistor Tr_1 is connected to a word line WL_1, and a source of the transistor Tr_1 is connected to a source line SL_1. A source of the transistor Tr_2 is connected to a source line SL_2, and a drain of the transistor Tr_2 is connected to a drain line DL_2. One terminal of the capacitor C is connected to a capacitor line CL. The other terminal of the capacitor C, a drain of the transistor Tr_1, and a gate of the transistor Tr_2 are connected to each other through a node N.

The memory cell utilizes variation in the nominal threshold voltage of the transistor Tr_2, which is caused corresponding to the potential of the node N. For example, FIG. 10B shows a relation between a voltage $V_{CL}$ of the capacitor line CL and a drain current $I_{d\_2}$ flowing through the transistor Tr_2.

Here, the voltage of the node N can be adjusted through the transistor Tr_1. For example, the potential of the source line SL_1 is set to VDD. In this case, when the potential of the word line WL_1 is set to be higher than or equal to a potential obtained by adding VDD to the threshold voltage Vth of the transistor Tr_1, the potential of the node N can be HIGH. Further, when the potential of the word line WL_1 is set to be lower than or equal to the threshold voltage Vth of the transistor Tr_1, the potential of the node N can be LOW.

Thus, either a $V_{CL}$-$I_{d\_2}$ curve (N=LOW) or a $V_{CL}$-$I_{d\_2}$ curve (N=HIGH) can be obtained. That is, when N=LOW, $I_{d\_2}$ is small at a $V_{CL}$ of 0V; accordingly, data 0 is stored. Further, when N=HIGH, $I_{d\_2}$ is large at a $V_{CL}$ of 0V; accordingly, data 1 is stored. In such a manner, data can be stored.

Here, when any of the transistors described in Embodiment 1 and 2 is used as the transistor Tr_1, the off-state current of the transistor can be significantly reduced; therefore, unintentional leakage of an electric charge accumulated in the node N by flowing between the source and the drain of the transistor Tr_1 can be suppressed. As a result, data can be held for a long time. Further, since the threshold voltage of the transistor Tr_1 according to one embodiment of the present invention is controlled, a voltage needed for writing can be reduced; thus, power consumption can be made small compared to a flash memory or the like.

Note that any of the transistors described in Embodiment 1 and 2 may be used as the transistor Tr_2. The transistor has excellent on-state characteristics. Accordingly, a semiconductor memory device including the transistor can operate at high speed.

As described above, according to one embodiment of the present invention, a semiconductor memory device with high reliability for a long time, low power consumption and high degree of integration can be obtained.

This embodiment can be implemented in appropriate combination with any of the other embodiments or examples.

(Embodiment 4)

A central processing unit (CPU) can be formed using any of the transistors described in Embodiment 1 and 2 or the semiconductor memory device described in Embodiment 3 for at least part of the CPU.

Figure 11A:
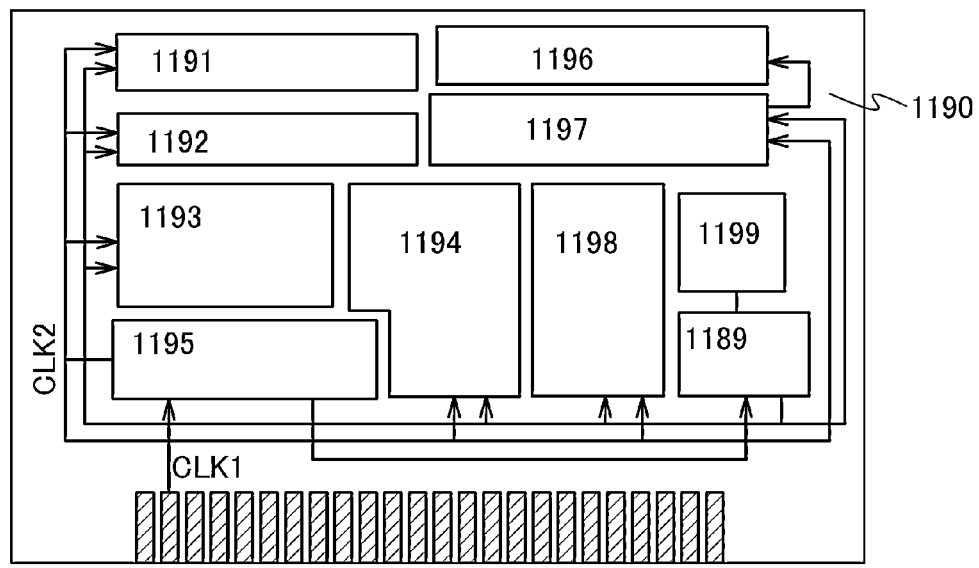
FIG. 11A is a block diagram illustrating a specific example of a CPU including a transistor according to an embodiment of the present invention and FIGS. 11B and 11C are circuit diagrams illustrating part of the CPU.

FIG. 11A is a block diagram illustrating a specific structure of the CPU. The CPU illustrated in FIG. 11A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 11A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 11A, a memory element is provided in the register 1196. As the memory element in the register 1196, for example, the semiconductor memory device described in Embodiment 3 can be used.

In the CPU illustrated in FIG. 11A, the register controller 1197 selects operation of retaining data in the register 1196 in accordance with an instruction from the ALU 1191. That is, the register controller 1197 selects whether data is retained by a flip-flop or a capacitor in the memory element included in the register 1196. When data is retained by the flip-flop, a power supply voltage is supplied to the memory element in the register 1196. When data is retained by the capacitor, the data in the capacitor is rewritten, and supply of the power supply voltage to the memory element in the register 1196 can be stopped.

Figure 11B:
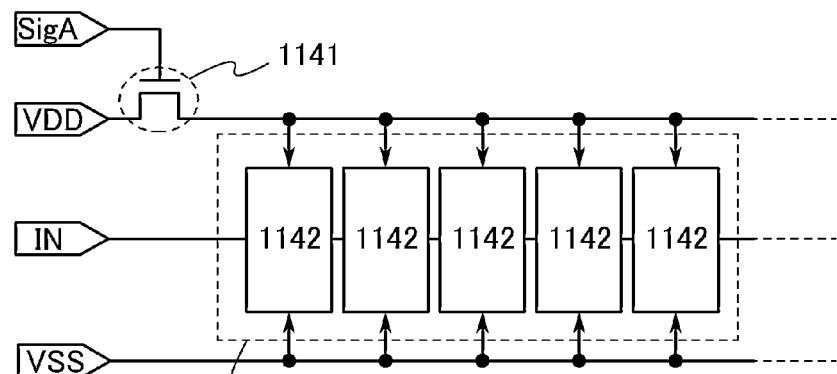
Figure 11C:
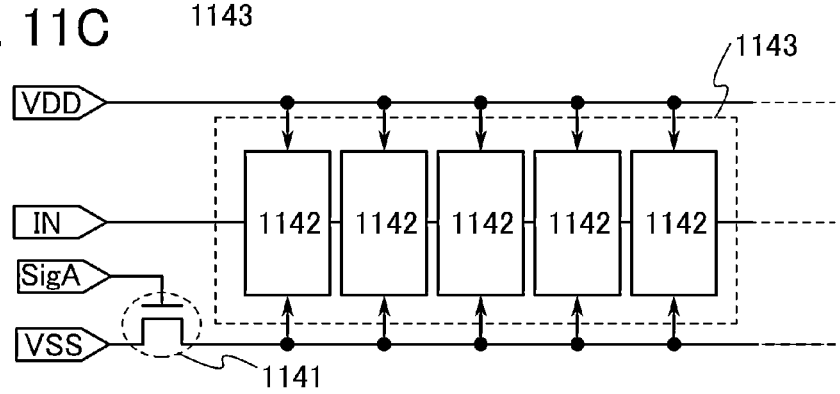

A switching element provided between a memory element group and a node to which a power supply potential VDD or a power supply potential VSS is supplied, as illustrated in FIG. 11B or FIG. 11C, allows the power supply voltage to be stopped. Circuits illustrated in FIGS. 11B and 11C will be described below.

FIGS. 11B and 11C each illustrate an example of a structure including any of the transistors described in Embodiment 1 and 2 as a switching element for controlling supply of a power supply potential to a memory element.

The memory device illustrated in FIG. 11B includes a switching element 1141 and a memory element group 1143 including a plurality of memory elements 1142. Specifically, as each of the memory elements 1142, the memory element described in Embodiment 3 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 11B, as the switching element 1141, a transistor in which a semiconductor with a wide band gap such as an oxide semiconductor is used for an active layer is used, and the switching of the transistor is controlled by a signal Sig A supplied to a gate electrode thereof.

Note that FIG. 11B illustrates the structure in which the switching element 1141 includes only one transistor; however, without limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 11C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor and the semiconductor memory device can also be applied to an LSI such as a digital signal processor (DSP), a custom LSI, or a field programmable gate array (FPGA).

This embodiment can be implemented in appropriate combination with any of the other embodiments or examples.
(Embodiment 5)

In this embodiment, examples of an electronic device including at least one of the transistors, the semiconductor memory device, and the CPU described in Embodiments 1 to 4 will be described.

Figure 12A:
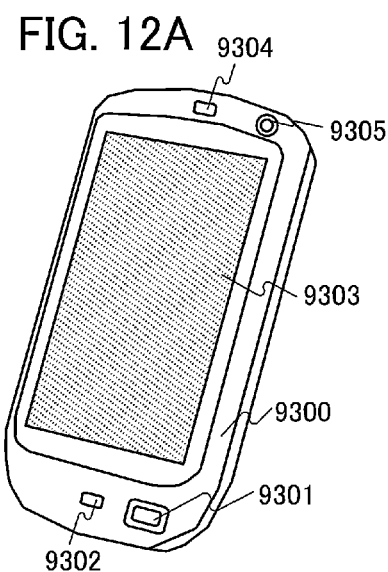
FIGS. 12A to 12D are perspective views each illustrating an example of an electronic device according to an embodiment of the present invention.

FIG. 12A illustrates a portable information terminal. The portable information terminal illustrated in FIG. 12A includes a housing 9300, a button 9301, a microphone 9302, a display portion 9303, a speaker 9304, and a camera 9305, and has a function as a mobile phone.

Figure 12B:
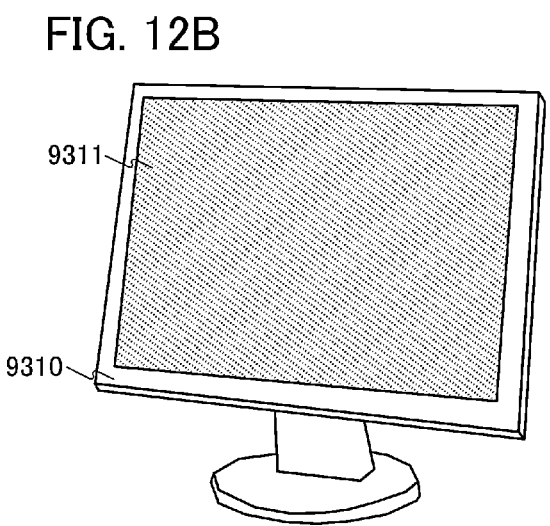

FIG. 12B illustrates a display. The display illustrated in FIG. 12B includes a housing 9310 and a display portion 9311.

Figure 12C:
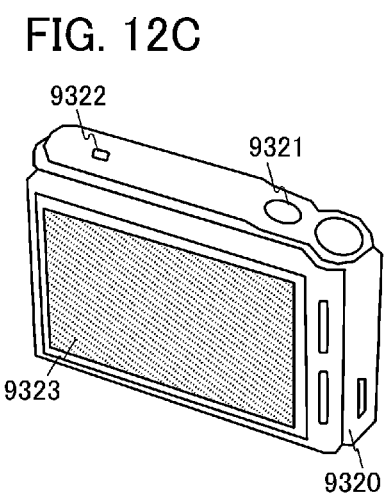

FIG. 12C illustrates a digital still camera. The digital still camera illustrated in FIG. 12C includes a housing 9320, a button 9321, a microphone 9322, and a display portion 9323.

Figure 12D:
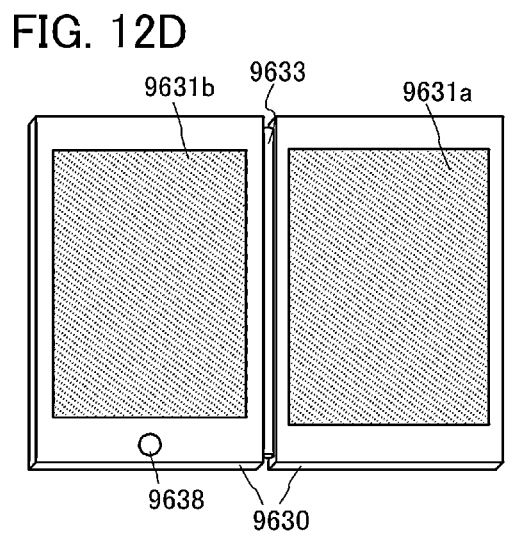

FIG. 12D illustrates a double-foldable portable information terminal. The double-foldable portable information terminal illustrated in FIG. 12D includes a housing 9630, a display portion 9631$a$, a display portion 9631$b$, a hinge 9633, and an operation switch 9638.

Part or whole of the display portion 9631$a$ and/or the display portion 9631$b$ can function as a touch panel. By touching an operation key displayed on the touch panel, a user can input data, for example.

By application of one embodiment of the present invention, the performance of an electronic device can be improved and the reliability of the electronic device can be improved.

This embodiment can be implemented in appropriate combination with any of the other embodiments.

EXAMPLE 1

In this example, the contact resistance between an oxide semiconductor film and a metal film was measured.

A method for making a measurement sample will be described below with reference to FIGS. 13A to 13C and FIGS. 14A and 14B.

First, a silicon oxide film 210 was formed over a glass substrate 200. The silicon oxide film 210 was formed with a thickness of 300 nm by a sputtering method.

Then, an In—Ga—Zn—O film, which is an oxide semiconductor film, was formed. The In—Ga—Zn—O film was formed with a thickness of 50 nm by a sputtering method using an In—Ga—Zn—O target (In:Ga:Zn=3:1:2 in an atomic ratio).

Next, the In—Ga—Zn—O film was processed into an island-shaped In—Ga—Zn—O film.

Then, a silicon oxynitride film 231 was formed. The silicon oxynitride film was formed with a thickness of 10 nm by a CVD method.

Figure 13A:
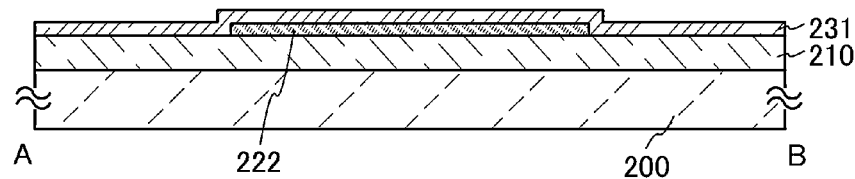
FIGS. 13A to 13C are cross-sectional views illustrating a method for making a sample.
Figure 13B:
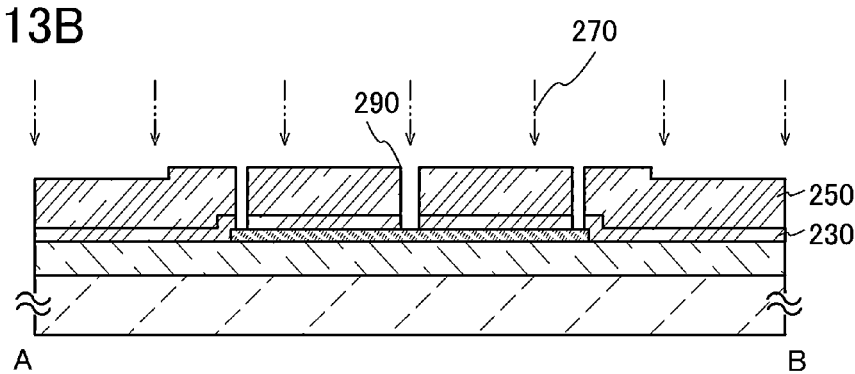
Figure 13C:
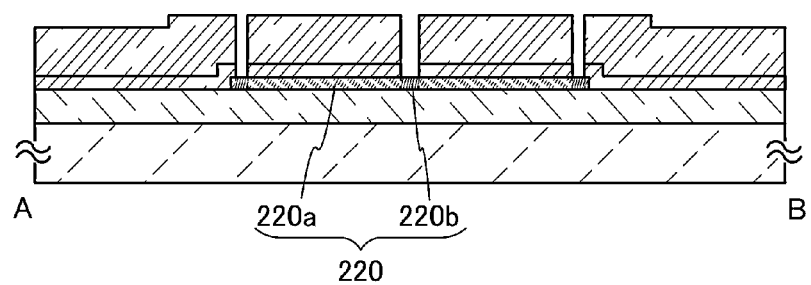

Then, phosphorus ions were added to the In—Ga—Zn—O film through the silicon oxynitride film 231 to reduce the resistance of the island-shaped In—Ga—Zn—O film; thus, an In—Ga—Zn—O film 222 was formed (see FIG. 13A). The addition of phosphorus ions was conducted with an ion implantation apparatus with an acceleration voltage of 30 kV and a dose of $1\times10^{15}$ ions/cm$^2$.

Next, a silicon oxynitride film was formed. The silicon oxynitride film was formed with a thickness of 300 nm by a CVD method. Then, the silicon oxynitride film and the silicon oxynitride film 231 were processed, so that a silicon oxynitride film 250 and a silicon oxynitride film 230 which have openings (e.g., an opening 290) that reach the In—Ga—Zn—O film 222 were formed. Here, the opening 290 has an upper surface shape of 2 μm×2 μm.

Next, treatment using microwave discharge nitrogen plasma 270 was performed (see FIG. 13B), so that the In—Ga—Zn—O film 222 was formed into an In—Ga—Zn—O film 220 including a low-resistance region 220$a$ and an oxynitride region 220$b$. The treatment using the microwave discharge nitrogen plasma 270 was performed for 180 seconds under the following conditions: the flow rates of argon and nitrogen were 1000 sccm and 500 sccm respectively, the pressure was 6 Pa, the temperature of a sample stage was 450° C., and an electric power of 3000 W (2.45 GHz) was applied to an antenna electrode.

Figure 15:
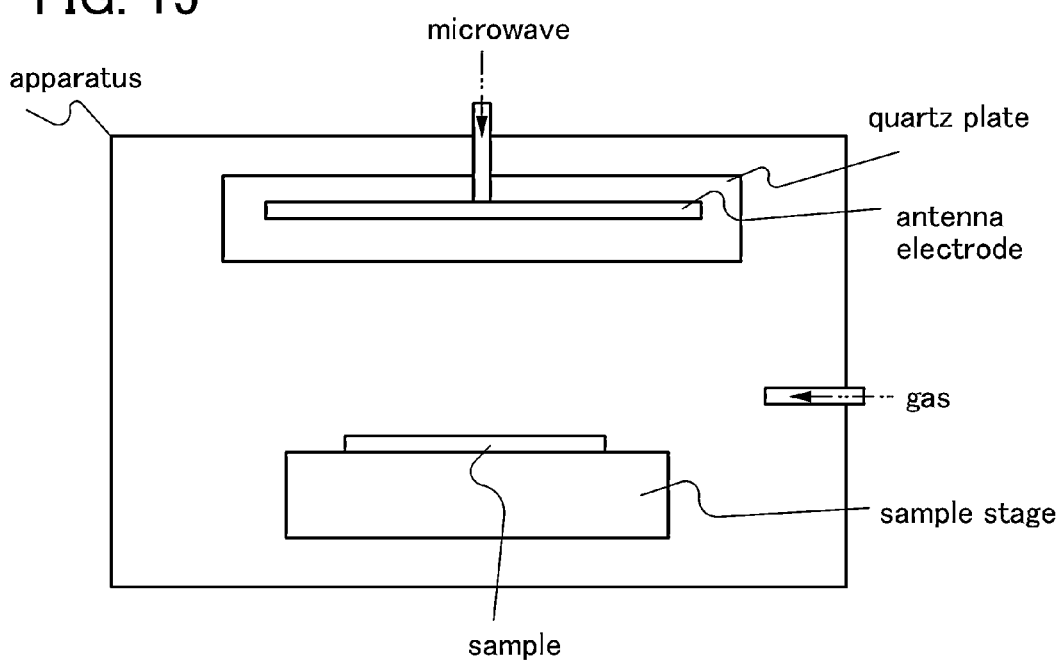
FIG. 15 illustrates an example of an apparatus capable of microwave discharge.

The treatment using the microwave discharge nitrogen plasma 270 was performed with an apparatus illustrated in FIG. 15. The apparatus illustrated in FIG. 15 includes a supply port that supplies a gas from the outside of the apparatus, a sample stage on which a sample is set, a quartz plate that functions as a slow wave plate, and an antenna electrode that is covered with the quartz plate and receives a microwave.

Next, a metal film was formed and processed into a metal film including a measurement pad 260a, a measurement pad 260b, a measurement pad 260c, and a measurement pad 260d. In this manner, a sample was made (see FIG. 14A and FIG. 14B). Note that as the metal film, a stacked-layer film in which a titanium film with a thickness of 50 nm, an aluminum film with a thickness of 100 nm, and a titanium film with a thickness of 50 nm were stacked, was used.

Figure 14A:
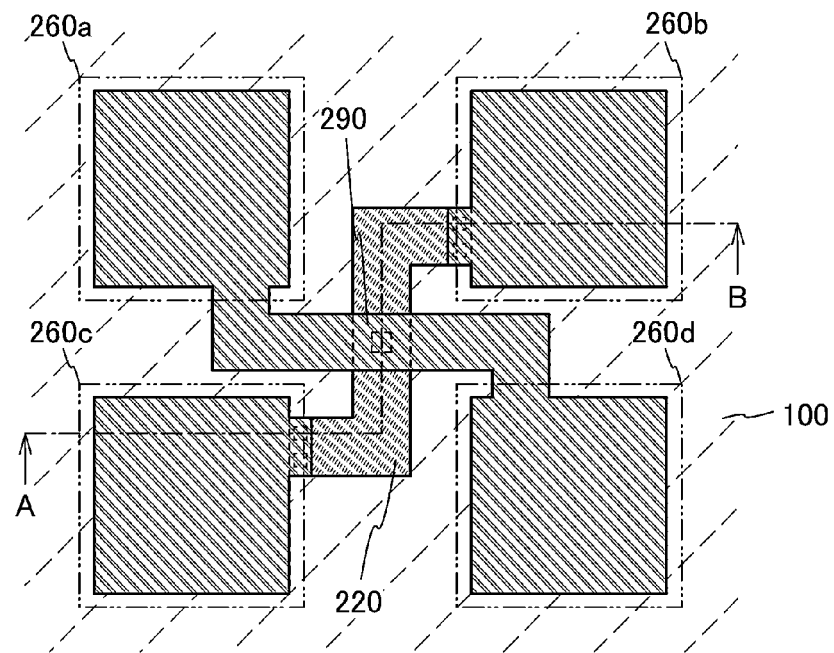
FIGS. 14A and 14B are a top view and a cross-sectional view, respectively, of a sample.
Figure 14B:
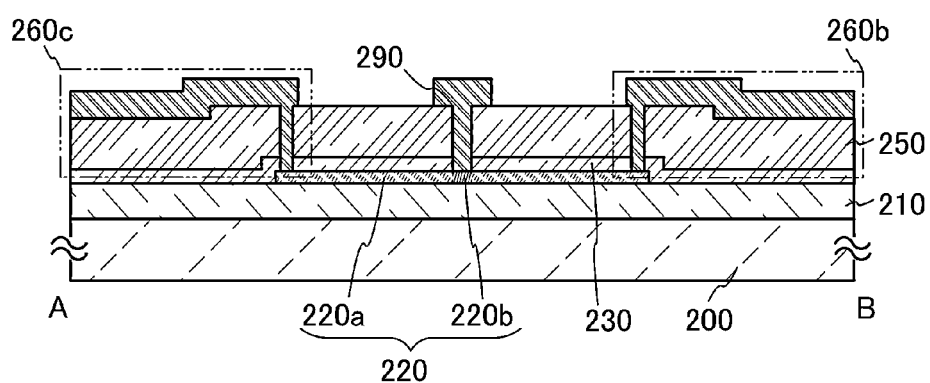

A cross section A-B in FIG. 14B is taken along dashed-dotted line A-B in the top view of FIG. 14A.

Next, heat treatment was performed on the sample in a clean room atmosphere at 300° C. for 1 hour.

A method for measuring contact resistance $R_C$ between the metal film and the In—Ga—Zn—O film in the sample will be described below with reference to FIG. 14A.

A current flowing between the measurement pad 260c and the measurement pad 260a was measured under a condition where a voltage between the measurement pad 260d and the measurement pad 260b was 0.25 V. The contact resistance $R_C$ is the value obtained by dividing 0.25 V by the measured current value.

A sample whose manufacturing method and structure are similar to those of the sample described in this example except that the treatment using the microwave discharge nitrogen plasma 270 was not performed was separately made. The contact resistance $R_C$ of the separately-made sample was 564.6Ω. Further, the contact resistance $R_C$ of the sample made in this example with the treatment using the microwave discharge nitrogen plasma 270 was 172.2Ω. Note that the above-mentioned contact resistance $R_C$ is the average value among five samples made under the same conditions.

The above shows that the microwave discharge nitrogen plasma treatment performed on the In—Ga—Zn—O film, which is an oxide semiconductor film, enables the contact resistance between the In—Ga—Zn—O film and the metal film to be reduced.

EXAMPLE 2

In this example, the bonding state of the surface after performing microwave discharge nitrogen plasma treatment on an oxide semiconductor film was evaluated.

A sample was made in the following manner.

First, a silicon oxide film was formed over a glass substrate. The silicon oxide film was formed with a thickness of 300 nm by a sputtering method.

Next, an In—Ga—Zn—O film, which is an oxide semiconductor film, was formed. The In—Ga—Zn—O film was formed with a thickness of 10 nm by a sputtering method using an In—Ga—Zn—O target (In:Ga:Zn=3:1:2 in an atomic ratio).

Next, microwave discharge nitrogen plasma treatment was performed on the In—Ga—Zn—O film. The microwave discharge nitrogen plasma treatment was performed for 180 seconds under the following conditions: the flow rates of argon and nitrogen were 1000 sccm and 200 sccm respectively, the pressure was 100 Pa, the temperature of a sample stage was 350° C., and an electric power of 3000 W (2.45 GHz) was applied to an antenna electrode.

Figure 18:
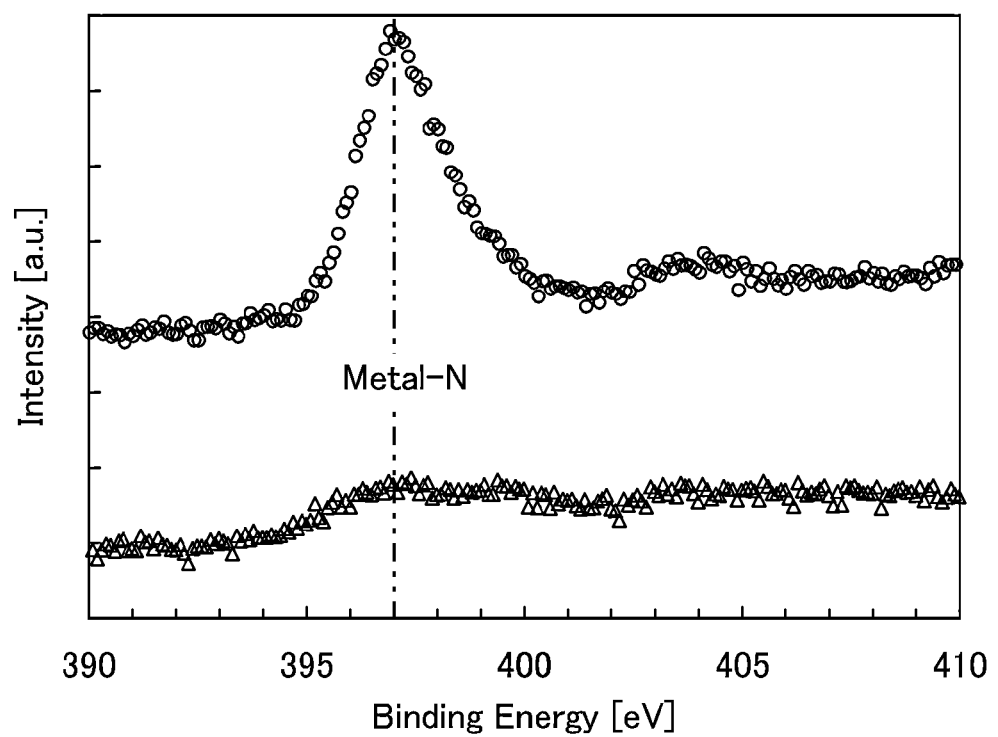
FIG. 18 shows XPS spectrum showing a bonding state of a surface of an oxide semiconductor film.

Bonding states of the surfaces of the sample made in the above-described manner and a reference sample made in a similar method except that the microwave discharge nitrogen plasma treatment was not performed were evaluated by X-ray photoelectron spectroscopy (XPS). FIG. 18 shows XPS spectra of the samples.

In FIG. 18, the spectrum indicated by triangle symbols represents the reference sample, while the spectrum indicated by circular symbols represents the sample made in this example.

Focusing on the binding energy around 397 eV that indicates metal-N bonding in FIG. 18, substantially no peak is observed for the reference sample, while a sharp peak is observed for the sample made in this example.

The above shows that the microwave discharge nitrogen plasma treatment on the oxide semiconductor film causes bonding between nitrogen and part of metal.

EXAMPLE 3

In this example, how the microwave discharge nitrogen plasma treatment affects the state of the interface between the oxide semiconductor film and the metal film was evaluated.

A sample was made in the following manner.

First, a silicon oxide film 301 was formed over a glass substrate 300. The silicon oxide film 301 was formed with a thickness of 330 nm by a sputtering method.

Then, a surface of the silicon oxide film 301 was polished by 30 nm by CMP treatment so as to be flat.

Next, an In—Ga—Zn—O film, which is an oxide semiconductor film, was formed. The In—Ga—Zn—O film was formed with a thickness of 30 nm by a sputtering method using an In—Ga—Zn—O target (In:Ga:Zn=3:1:2 in an atomic ratio).

Next, heat treatment was performed at 450° C. in a nitrogen atmosphere for 1 hour, and then heat treatment was further performed at 450° C. in an oxygen atmosphere for 1 hour.

Next, the In—Ga—Zn—O film was processed into an island-shaped In—Ga—Zn—O film.

Then, a silicon oxynitride film was formed. The silicon oxynitride film was formed with a thickness of 20 nm by a CVD method.

Then, boron ions were added into the In—Ga—Zn—O film through the silicon oxynitride film to reduce the resistance of the island-shaped In—Ga—Zn—O film; thus, an In—Ga—Zn—O film 302 was formed. The addition of boron ions was conducted with an ion implantation apparatus with an acceleration voltage of 15 kV and a dose of $1\times10^{15}$ ions/cm$^2$.

Next, a silicon oxynitride film was formed. The silicon oxynitride film was formed with a thickness of 300 nm by a CVD method. In this manner, a silicon oxide film 303 in which the silicon oxide film with a thickness of 20 nm and the silicon oxide film with a thickness of 300 nm were stacked was formed.

Then, openings that reach the In—Ga—Zn—O film 302 were provided in the silicon oxide film 303.

Next, microwave discharge nitrogen plasma treatment was performed on an exposed region of the In—Ga—Zn—O film 302. The microwave discharge nitrogen plasma treatment was performed for 180 seconds under the following conditions: the flow rates of argon and nitrogen were 1000 sccm and 200 sccm respectively, the pressure was 40 Pa, the temperature of a sample stage was 300° C., and an electric power of 2000 W (2.45 GHz) was applied to an antenna electrode.

Next, an aluminum alloy film including a slight amount of nickel and a slight amount of lanthanum was formed. The aluminum alloy film was formed with a thickness of 300 nm by a sputtering method.

Then, a metal film 304 was formed by processing the aluminum alloy film.

Next, heat treatment was performed on the sample at 300° C. in a clean room atmosphere for 1 hour.

Cross-sectional shapes of the sample made in the above-described manner and a reference sample made in a similar method except that the microwave discharge nitrogen plasma treatment was not performed were observed with a scanning transmission electron microscope (STEM).

Figure 16A:
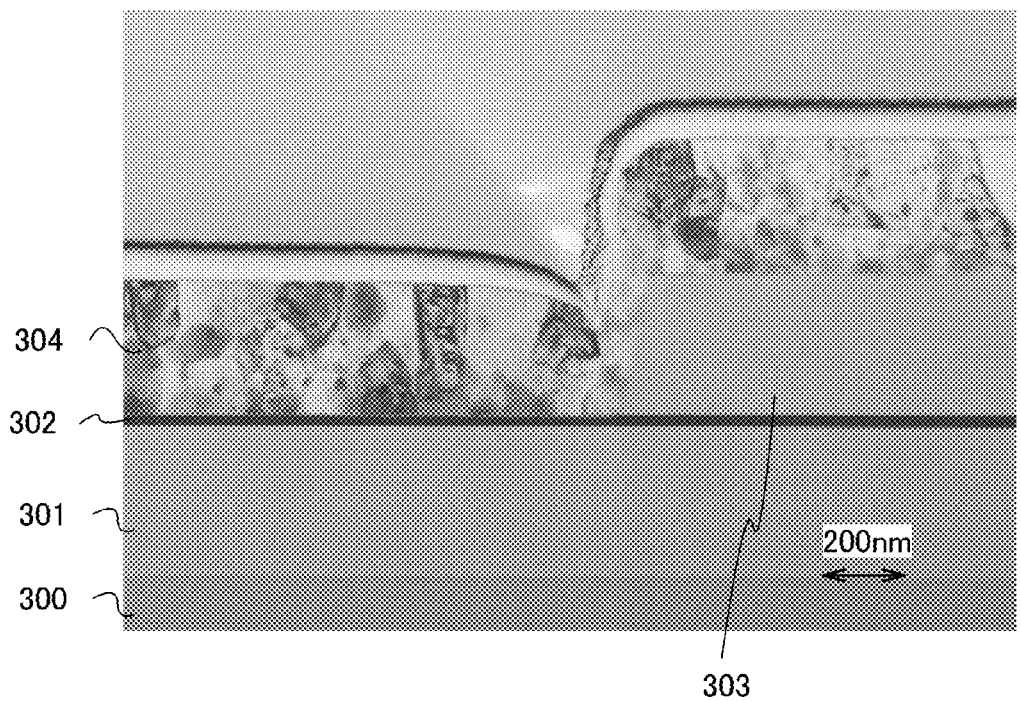
FIGS. 16A and 16B are TE images of a cross section of a sample, which are taken with a STEM.
Figure 16B:
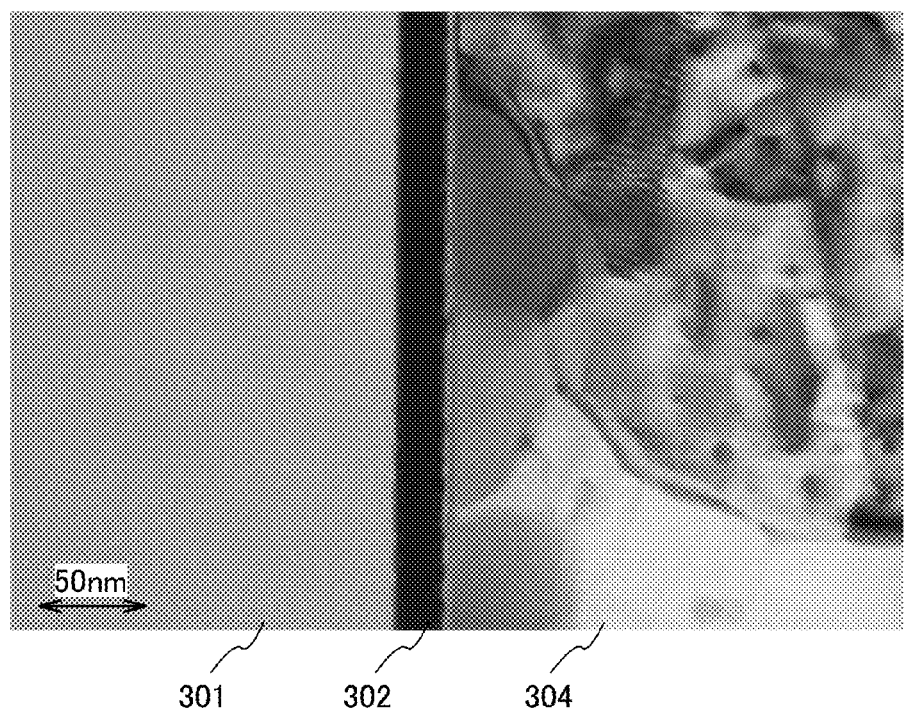

Here, FIGS. 16A and 16B show phase contrast images (also referred to as transmitted electron images or TE images) of a cross-sectional shape of the reference sample. Note that FIG. 16B is an enlarged view showing the vicinity of the interface between the In—Ga—Zn—O film 302 and the metal film 304 in FIG. 16A.

Figure 17A:
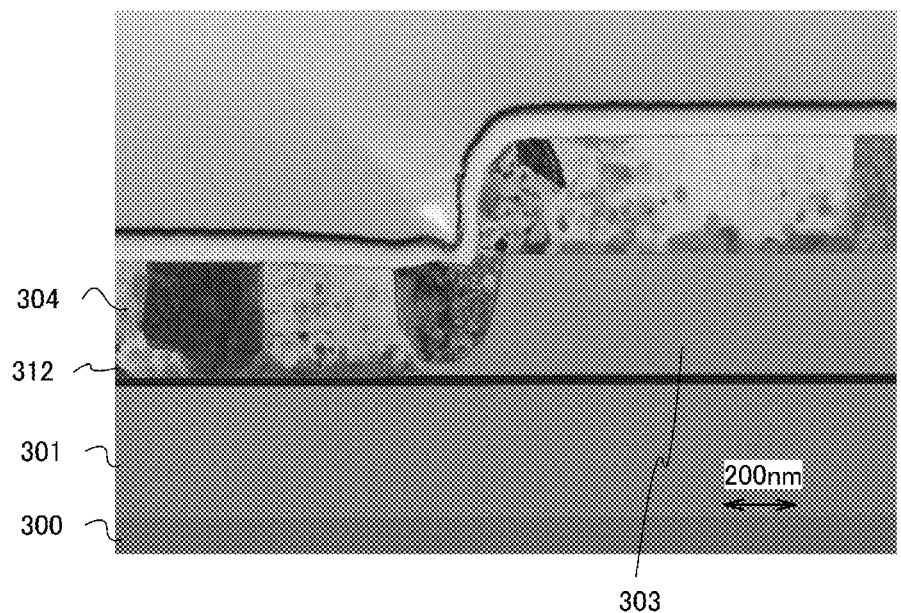
FIGS. 17A and 17B are TE images of a cross section of a sample, which are taken with a STEM.
Figure 17B:
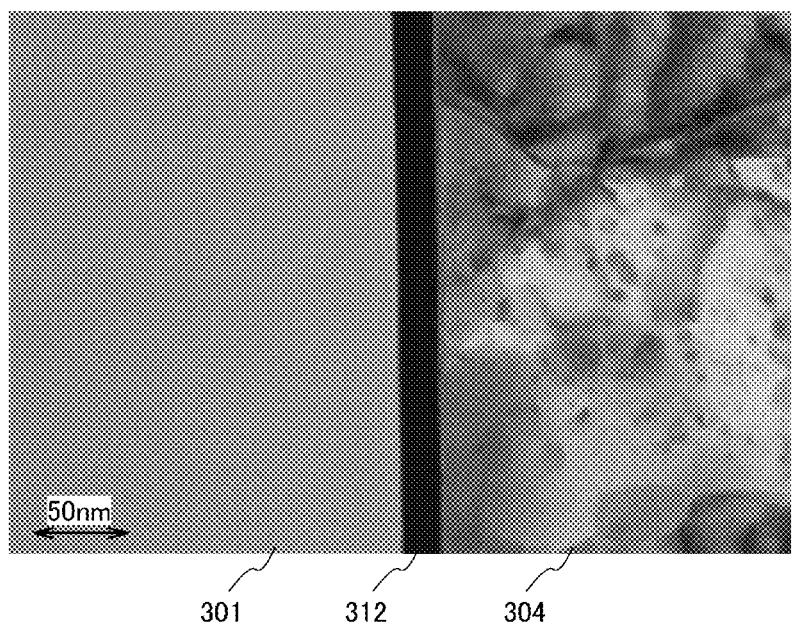

Similarly, FIGS. 17A and 17B show TE images of a cross-sectional shape of the sample made in this example. Note that FIG. 17B is an enlarged view showing the vicinity of the interface between the In—Ga—Zn—O film 312 and the metal film 304 in FIG. 17A.

In FIG. 16B, a layer that is not the In—Ga—Zn—O film 302 or the metal film 304 (another layer) with a thickness of several nanometers is formed at the interface between the In—Ga—Zn—O film 302 and the metal film 304.

In FIG. 17B, such another layer is not formed at the interface between the In—Ga—Zn—O film 312 and the metal film 304.

The above shows that by performing microwave discharge nitrogen plasma treatment on the oxide semiconductor film before formation of the metal film, such another layer is less likely to be generated at the interface between the oxide semiconductor film and the metal film.

This application is based on Japanese Patent Application serial no. 2011-199652 filed with Japan Patent Office on Sep. 13, 2011, the entire contents of which are hereby incorporated by reference.

What is claimed is:

1. A manufacturing method of a semiconductor device, comprising the steps of:
   forming an oxide semiconductor film on an insulating surface;
   forming a gate insulating film over the oxide semiconductor film;
   forming a gate electrode over the gate insulating film;
   forming an interlayer insulating film covering the oxide semiconductor film, the gate insulating film, and the gate electrode;
   forming an opening in the interlayer insulating film reaching the oxide semiconductor film;
   performing nitrogen plasma treatment on the oxide semiconductor film through the opening in the interlayer insulating film; and
   forming a metal film in the opening and over the interlayer insulating film.

2. The manufacturing method of the semiconductor device according to claim 1, wherein the nitrogen plasma treatment is microwave discharge nitrogen plasma treatment.

3. The manufacturing method of the semiconductor device according to claim 1, wherein the oxide semiconductor film comprises a crystalline region having a c-axis aligned in a direction perpendicular to a surface of the oxide semiconductor film.

4. The manufacturing method of the semiconductor device according to claim 1, wherein the oxide semiconductor film comprises at least one element selected from In, Ga, Sn, and Zn.

5. The manufacturing method of the semiconductor device according to claim 1, wherein the nitrogen plasma treatment is performed at a temperature of 300° C. or higher.

6. The manufacturing method of the semiconductor device according to claim 1, further comprising the step of reducing a resistance of part of the oxide semiconductor film to form a low-resistance region after the step of forming the gate electrode.

7. The manufacturing method of the semiconductor device according to claim 6, wherein the low-resistance region comprises at least one kind of element selected from hydrogen, helium, boron, nitrogen, fluorine, neon, aluminum, phosphorus, argon, arsenic, krypton, indium, tin, antimony, and xenon.

8. The manufacturing method of the semiconductor device according to claim 6, wherein a sheet resistance in the low-resistance region is reduced to be 30 kΩ/sq or less.

9. A manufacturing method of a semiconductor device, comprising the steps of:
   forming a source electrode and a drain electrode on an insulating surface;
   forming an oxide semiconductor film over the source electrode and the drain electrode;
   forming a gate insulating film over the oxide semiconductor film;
   forming a gate electrode over the gate insulating film;
   reducing a resistance of part of the oxide semiconductor film to form a low-resistance region;
   forming an interlayer insulating film covering the oxide semiconductor film, the gate insulating film, and the gate electrode;
   forming an opening in the interlayer insulating film reaching the oxide semiconductor film;
   performing nitrogen plasma treatment on the oxide semiconductor film through the opening in the interlayer insulating film; and
   forming a metal film in the opening and over the interlayer insulating film.

10. The manufacturing method of the semiconductor device according to claim 9, wherein the nitrogen plasma treatment is microwave discharge nitrogen plasma treatment.

11. The manufacturing method of the semiconductor device according to claim 9, wherein the oxide semiconductor film comprises a crystalline region having a c-axis aligned in a direction perpendicular to a surface of the oxide semiconductor film.

12. The manufacturing method of the semiconductor device according to claim 9, wherein the oxide semiconductor film comprises at least one element selected from In, Ga, Sn, and Zn.

13. The manufacturing method of the semiconductor device according to claim 9, wherein the low-resistance region comprises at least one kind of element selected from hydrogen, helium, boron, nitrogen, fluorine, neon, aluminum, phosphorus, argon, arsenic, krypton, indium, tin, antimony, and xenon.

14. The manufacturing method of the semiconductor device according to claim 9, wherein a sheet resistance in the low-resistance region is reduced to be 30 kΩ/sq or less.

15. The manufacturing method of the semiconductor device according to claim 9, wherein the nitrogen plasma treatment is performed at a temperature of 300° C. or higher.

16. The manufacturing method of the semiconductor device according to claim 9, wherein the source electrode and the drain electrode are formed by planarizing a conductive film on an insulating film with depressions so that the source electrode and the drain electrode are formed in the depressions.

* * * * *